United States Patent
Kim et al.

(10) Patent No.: US 10,163,744 B2
(45) Date of Patent: Dec. 25, 2018

(54) SEMICONDUCTOR DEVICE AND METHOD OF FORMING A LOW PROFILE DUAL-PURPOSE SHIELD AND HEAT-DISSIPATION STRUCTURE

(75) Inventors: OhHan Kim, Kyonggi-do (KR); WonJun Ko, Kyungki-Do (KR); DaeSik Choi, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 673 days.

(21) Appl. No.: 13/226,767

(22) Filed: Sep. 7, 2011

(65) Prior Publication Data
US 2013/0056862 A1 Mar. 7, 2013

(51) Int. Cl.
*H01L 23/14* (2006.01)
*H01L 23/00* (2006.01)
(Continued)

(52) U.S. Cl.
CPC .......... *H01L 23/147* (2013.01); *H01L 21/561* (2013.01); *H01L 23/13* (2013.01);
(Continued)

(58) Field of Classification Search
CPC ....... H01L 23/147; H01L 24/92; H01L 24/73; H01L 25/0657; H01L 23/3128; H01L 23/13; H01L 23/552; H01L 25/105; H01L 23/36; H01L 23/3677; H01L 23/49575; H01L 24/97; H01L 23/49827; H01L 21/561; H01L 2224/05554; H01L 2924/12042; H01L 2924/181; H01L 2224/0401; H01L 2924/1306; H01L 2924/3025; H01L 2224/48091; H01L 2224/16225; H01L 2924/3011; H01L 2224/293; H01L 2224/2929; H01L 2224/2919; H01L 2224/13139;
(Continued)

(56) References Cited

U.S. PATENT DOCUMENTS 5,675,182 A * 10/1997 Moscicki .......... H01L 23/49568
165/80.3
6,373,705 B1 * 4/2002 Koelle .................... H01L 23/36
165/104.33
(Continued)

*Primary Examiner* — Steven Loke
*Assistant Examiner* — Juanita B Rhodes
(74) *Attorney, Agent, or Firm* — Robert D. Atkins; Patent Law Group: Atkins and Associates, P.C.

(57) ABSTRACT

A semiconductor device has a substrate including a recess and a peripheral portion with through conductive vias. A first semiconductor die is mounted over the substrate and within the recess. A planar heat spreader is mounted over the substrate and over the first semiconductor die. The planar heat spreader has openings around a center portion of the planar heat spreader and aligned over the peripheral portion of the substrate. A second semiconductor die is mounted over the center portion of the planar heat spreader. A third semiconductor die is mounted over the second semiconductor die. First and second pluralities of bond wires extend from the second and third semiconductor die, respectively, through the openings in the planar heat spreader to electrically connect to the through conductive vias. An encapsulant is deposited over the substrate and around the planar heat spreader.

14 Claims, 20 Drawing Sheets

(51) Int. Cl.
*H01L 25/065* (2006.01)
*H01L 23/495* (2006.01)
*H01L 21/56* (2006.01)
*H01L 23/552* (2006.01)
*H01L 23/31* (2006.01)
*H01L 25/10* (2006.01)
*H01L 23/13* (2006.01)
*H01L 23/367* (2006.01)
*H01L 23/36* (2006.01)
*H01L 23/498* (2006.01)

(52) U.S. Cl.
CPC .......... *H01L 23/3128* (2013.01); *H01L 23/36* (2013.01); *H01L 23/3677* (2013.01); *H01L 23/49575* (2013.01); *H01L 23/49827* (2013.01); *H01L 23/552* (2013.01); *H01L 24/73* (2013.01); *H01L 24/92* (2013.01); *H01L 24/97* (2013.01); *H01L 25/0657* (2013.01); *H01L 25/105* (2013.01); *H01L 23/49816* (2013.01); *H01L 2224/0401* (2013.01); *H01L 2224/05554* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/11849* (2013.01); *H01L 2224/11901* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/16235* (2013.01); *H01L 2224/16238* (2013.01); *H01L 2224/293* (2013.01); *H01L 2224/2919* (2013.01); *H01L 2224/2929* (2013.01); *H01L 2224/29139* (2013.01); *H01L 2224/29186* (2013.01); *H01L 2224/32145* (2013.01); *H01L 2224/32225* (2013.01); *H01L 2224/32245* (2013.01); *H01L 2224/48091* (2013.01); *H01L 2224/48227* (2013.01); *H01L 2224/49175* (2013.01); *H01L 2224/73253* (2013.01); *H01L 2224/73265* (2013.01); *H01L 2224/81191* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/83191* (2013.01); *H01L 2224/92225* (2013.01); *H01L 2224/92247* (2013.01); *H01L 2224/97* (2013.01); *H01L 2225/0651* (2013.01); *H01L 2225/06517* (2013.01); *H01L 2225/06568* (2013.01); *H01L 2225/06575* (2013.01); *H01L 2225/06589* (2013.01); *H01L 2225/1058* (2013.01); *H01L 2225/1094* (2013.01); *H01L 2924/01029* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15153* (2013.01); *H01L 2924/181* (2013.01); *H01L 2924/3011* (2013.01); *H01L 2924/3025* (2013.01)

(58) Field of Classification Search
CPC . H01L 2224/05647; H01L 2224/92247; H01L 2224/92225; H01L 2224/83191; H01L 2224/81455; H01L 2224/81447; H01L 2224/81444; H01L 2224/05611; H01L 2224/05624; H01L 2224/05639; H01L 2224/05644; H01L 2224/81439; H01L 2224/05655; H01L 2224/11849; H01L 2224/11901; H01L 2224/13111; H01L 2224/13113; H01L 2224/13116; H01L 2224/13124; H01L 2224/81424; H01L 2224/13144; H01L 2224/13147; H01L 2224/13155; H01L 2224/16235; H01L 2224/16238; H01L 2224/29139; H01L 2224/29186; H01L 2224/73253; H01L 2224/81191; H01L 2224/81411; H01L 2924/01322; H01L 2924/12041; H01L 2225/0651; H01L 2225/06517; H01L 2225/06575; H01L 2225/06589; H01L 2225/06568; H01L 2225/1094; H01L 2225/1058; H01L 2924/01029; H01L 2224/32245; H01L 2224/48227; H01L 2924/13091; H01L 2224/73265; H01L 2224/32145; H01L 2224/32225; H01L 2224/97; H01L 2224/49175; H01L 23/49816
USPC ... 257/48, 99, 200, 621, 659, 675, 676, 378, 257/685, 686, 698, 700, 704, 706, 707, 257/712, 713, 720, 722, 723, 738, 739, 257/751, 111, 778, 784, 796; 438/26, 438/106, 107, 108, 109, 111, 115, 118, 438/119, 122, 123, 125, 126, 613
See application file for complete search history.

(56) References Cited

U.S. PATENT DOCUMENTS

| | | | |
|---|---|---|---|
| 6,472,741 B1* | 10/2002 | Chen | H01L 23/3128 257/712 |
| 6,492,726 B1* | 12/2002 | Quek | H01L 23/055 257/723 |
| 6,818,978 B1* | 11/2004 | Fan | H01L 23/3128 257/685 |
| 6,919,631 B1* | 7/2005 | Hoffman | H01L 23/3128 257/707 |
| 6,975,025 B2 | 12/2005 | LeBonheur et al. | |
| 7,217,993 B2 | 5/2007 | Nishimura | |
| 2004/0065963 A1* | 4/2004 | Karnezos | H01L 23/3128 257/777 |
| 2008/0048309 A1* | 2/2008 | Corisis | H01L 23/13 257/686 |
| 2008/0073777 A1* | 3/2008 | Cui | H01L 25/0657 257/707 |
| 2008/0277776 A1* | 11/2008 | Enomoto | H01L 21/486 257/700 |
| 2009/0289336 A1* | 11/2009 | Meghro | H01L 23/49517 257/676 |
| 2009/0294947 A1* | 12/2009 | Tain | H01L 25/0657 257/686 |
| 2011/0095403 A1* | 4/2011 | Lee | H01L 21/4857 257/660 |

* cited by examiner

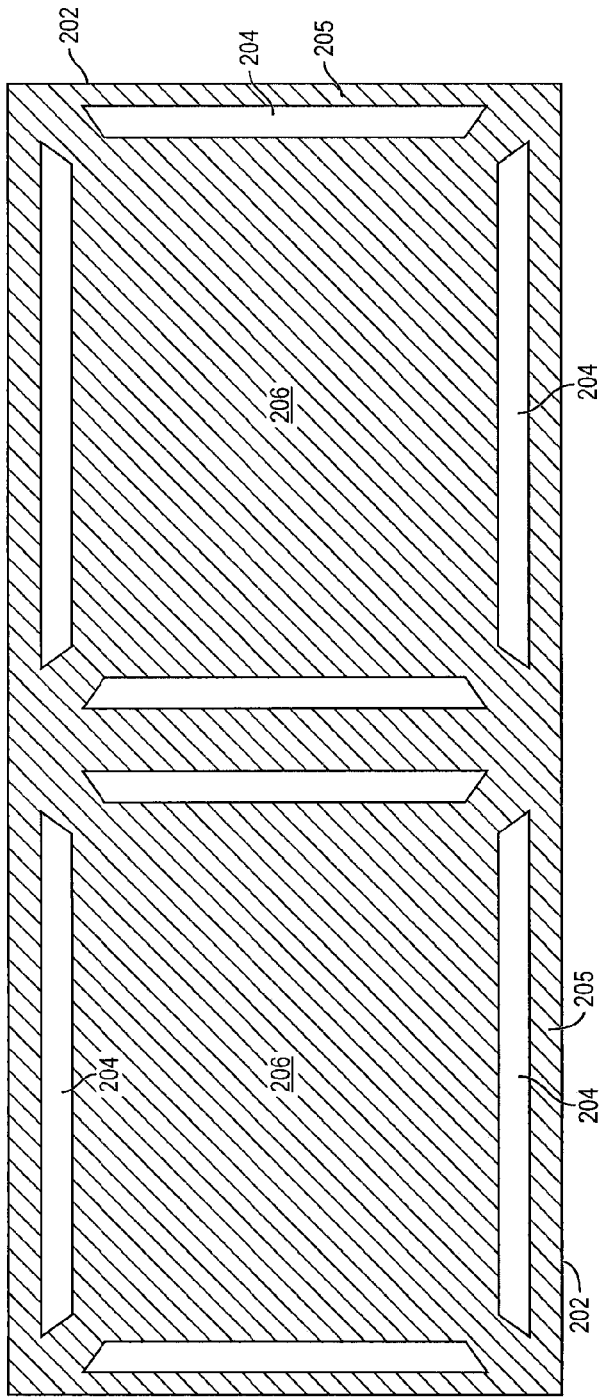
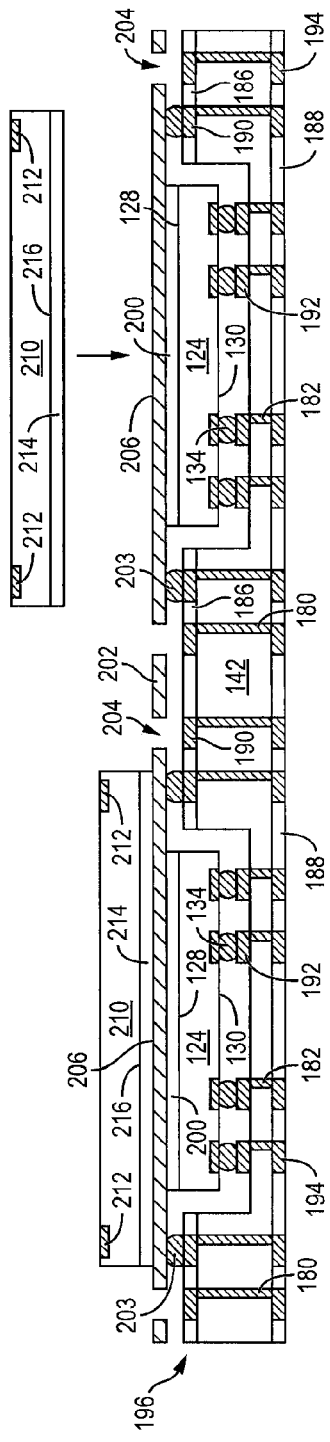
FIG. 4n
FIG. 4o

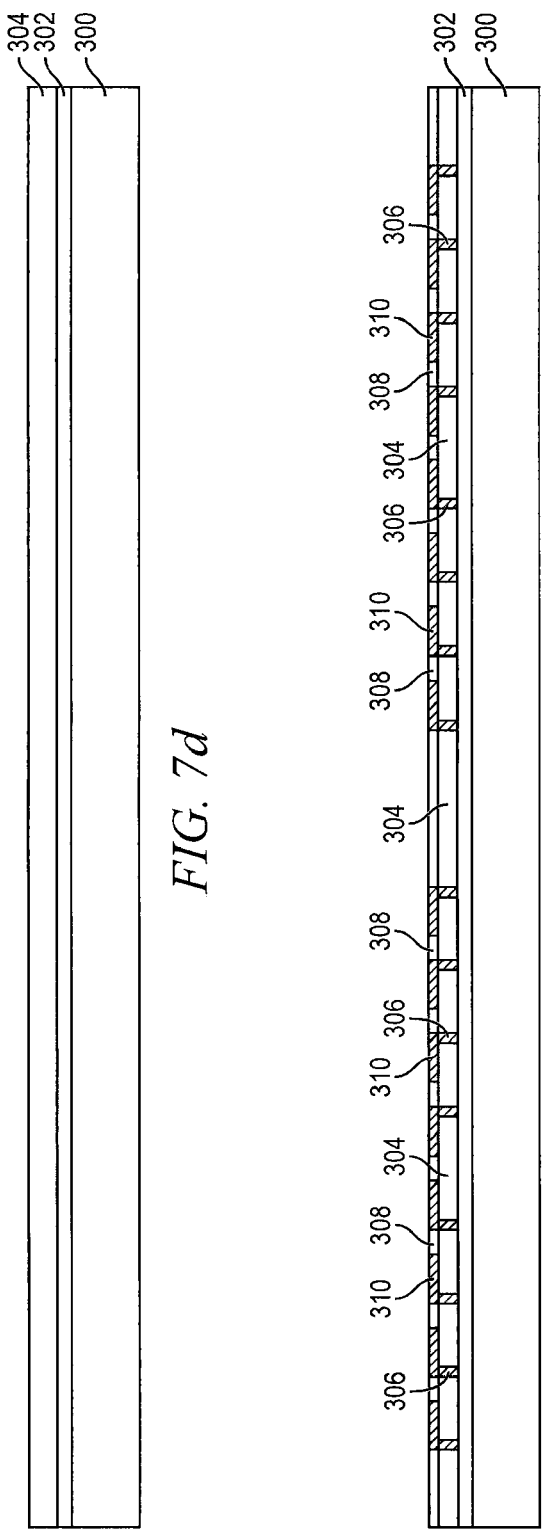
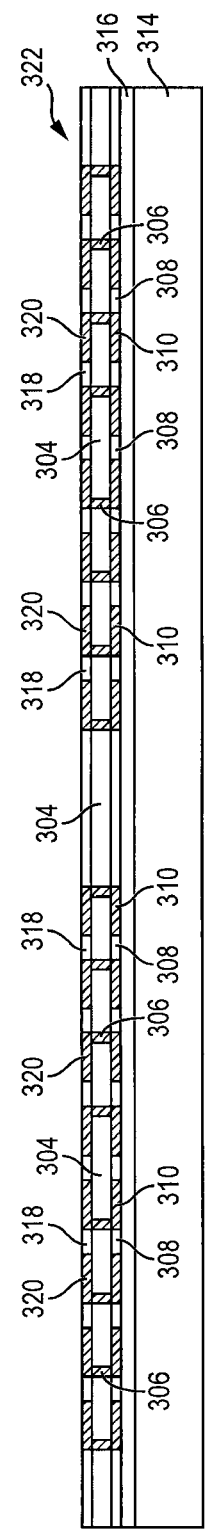
FIG. 7d
FIG. 7e
FIG. 7f

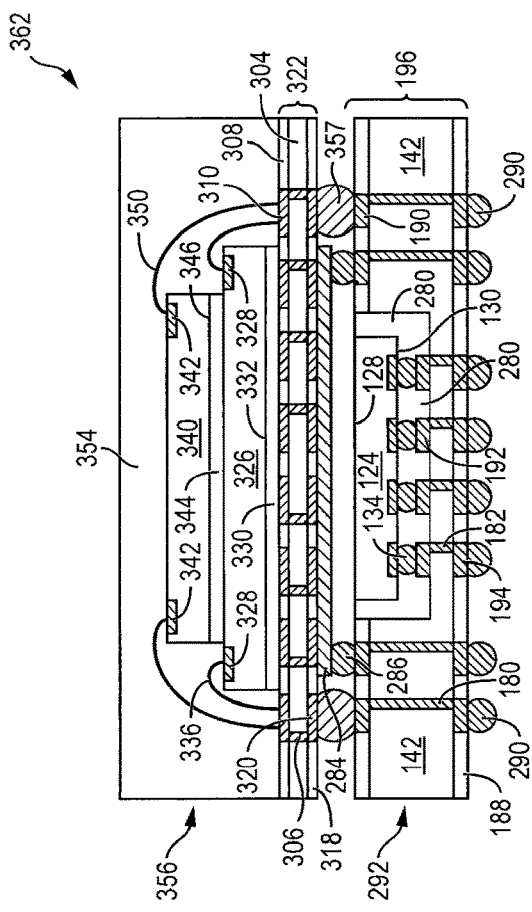
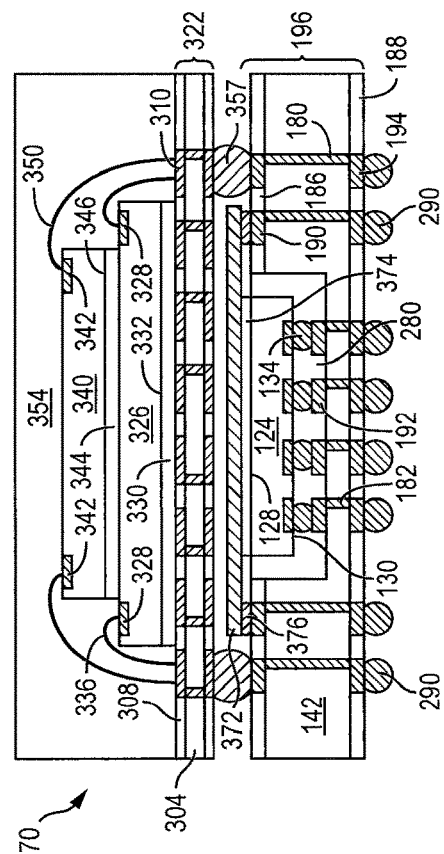
FIG. 7n
FIG. 8

SEMICONDUCTOR DEVICE AND METHOD OF FORMING A LOW PROFILE DUAL-PURPOSE SHIELD AND HEAT-DISSIPATION STRUCTURE

FIELD OF THE INVENTION

The present invention relates in general to semiconductor devices and, more particularly, to a semiconductor device and method of forming a low profile dual-purpose shield and heat-dissipation structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), harmonic distortion, or other inter-device interference, such as capacitive, inductive, or conductive coupling, also known as cross-talk, which can interfere with their operation. To improve operation of semiconductor devices, inter-device interference among semiconductor devices is reduced through the use of shielding layers.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

Conventional semiconductor packages address both the goals of providing adequate heat dissipation and reducing inter-device interference. However, dual-purpose shield and heat spreader devices often increase package profile contrary to the goal of producing smaller semiconductor devices. Additionally, dual-purpose shield and heat spreader devices include structures that are difficult to manufacture, thereby increasing cost.

SUMMARY OF THE INVENTION

A need exists for a simple and cost effective low profile semiconductor device including a dual-purpose shield and heat-dissipation structure with multiple vertically stacked semiconductor die. Accordingly, in one embodiment, the present invention is a method of making a semiconductor device comprising the steps of providing a substrate including a recess and a peripheral portion with through conductive vias, mounting a first semiconductor die over the substrate and within the recess, and mounting a planar heat spreader over the substrate and over the first semiconductor die. The planar heat spreader has openings formed around a center portion of the planar heat spreader and aligned over the peripheral portion of the substrate. The method further includes the steps of mounting a second semiconductor die over the center portion of the planar heat spreader, forming a first plurality of bond wires that extend from the second semiconductor die through the openings in the planar heat spreader to electrically connect to the through conductive vias, and depositing an encapsulant over the substrate, around the first and second semiconductor die, and around the planar heat spreader.

In another embodiment, the present invention is a method of making a semiconductor device comprising the steps of providing a substrate including a recess and a peripheral portion with conductive vias, mounting a first semiconductor die over the substrate and within the recess, and mounting a heat spreader over the substrate and over the first semiconductor die. The heat spreader has openings around a center portion of the heat spreader that are aligned over the peripheral portion of the substrate. The method further includes mounting a second semiconductor die over the center portion of the heat spreader, and forming a first plurality of bond wires that extend from the second semiconductor die through the openings to electrically connect to the conductive vias.

In another embodiment, the present invention is a method of making a semiconductor device comprising the steps of providing a substrate including a recess and a peripheral portion with conductive vias, mounting a first semiconductor die over the substrate and within the recess, mounting a planar heat spreader over the substrate and over the first semiconductor die, mounting a second semiconductor die over a center portion of the planar heat spreader, and forming a first plurality of bond wires that electrically connects the second semiconductor die to the conductive vias.

In another embodiment, the present invention is a semiconductor device comprising a substrate including a recess and a peripheral portion with conductive vias. A first semiconductor die is mounted over the substrate and within the recess. A heat spreader is mounted over the substrate and over the first semiconductor die. The heat spreader has openings around a center portion of the heat spreader that are aligned over the peripheral portion of the substrate in the periphery of the recess. A second semiconductor die is mounted over the center portion of the heat spreader. A first plurality of bond wires extends from the second semiconductor die through the openings to electrically connect to the conductive vias.

BRIEF DESCRIPTION OF THE DRAWINGS

FIG. 8 illustrates another embodiment of a low profile semiconductor device including a dual-purpose shield and heat-dissipation structure and multiple vertically stacked semiconductor die.

DETAILED DESCRIPTION OF THE DRAWINGS

Figure 1:
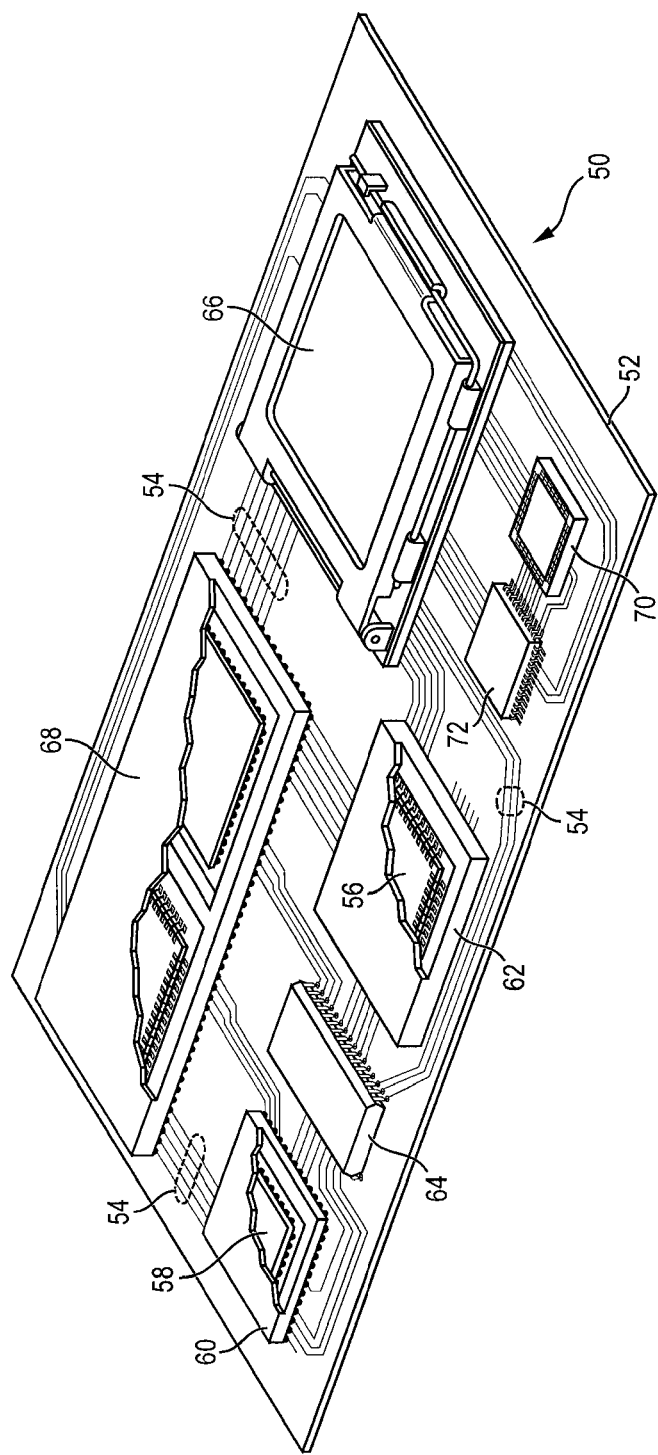
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a lightsensitive material that undergoes changes in structure and properties when exposed to light. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

The process of changing the structure and properties of the photoresist occurs as either negative-acting photoresist or positive-acting photoresist. In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
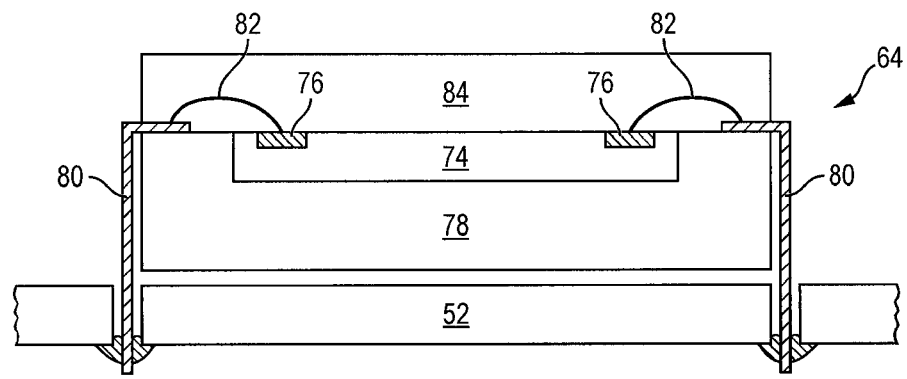
FIGS. 2a-2c illustrate further detail of the representative semiconductor packages mounted to the PCB.
Figure 2B:
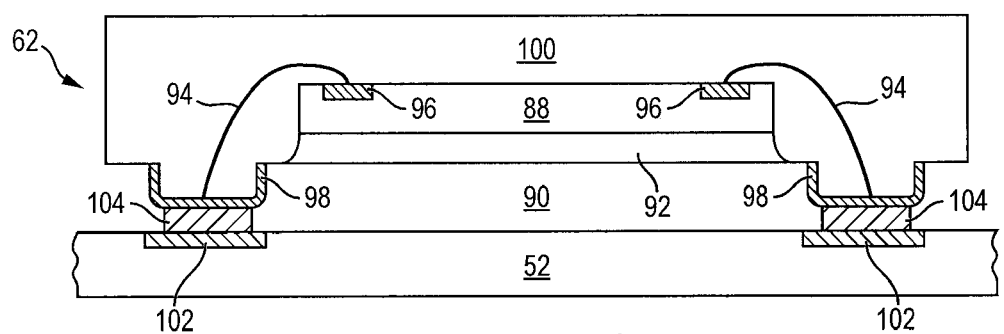
Figure 2C:
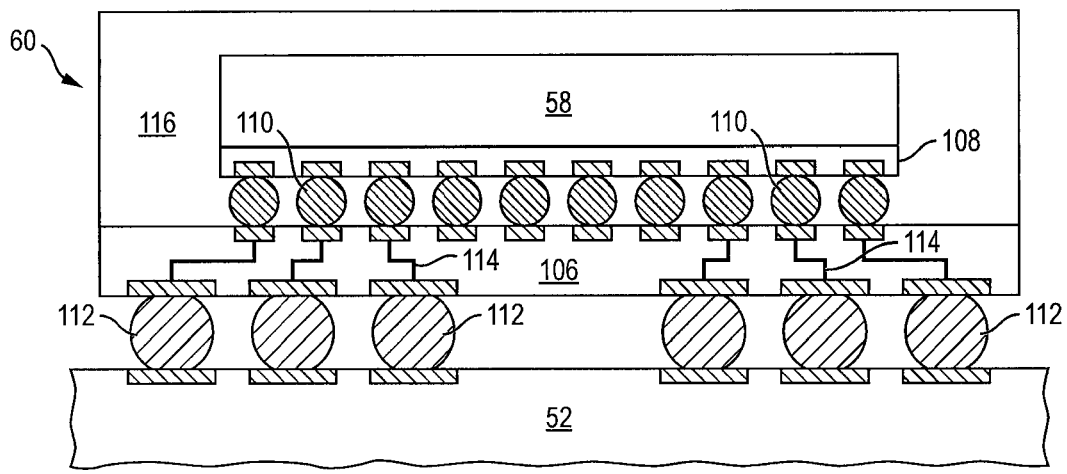

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
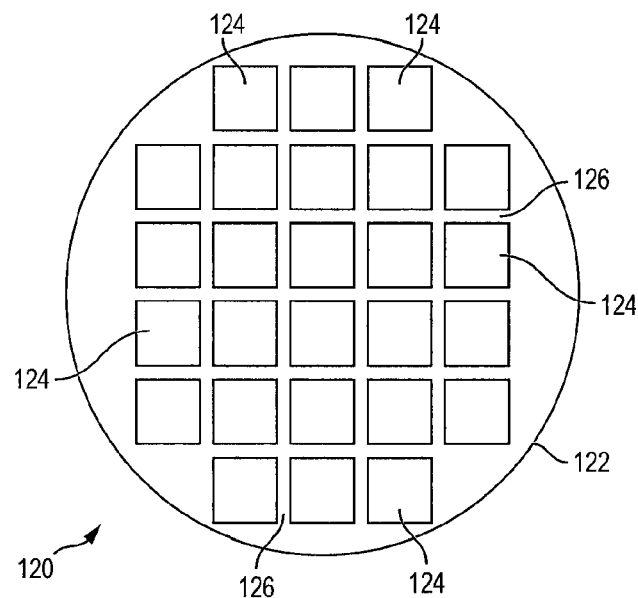
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
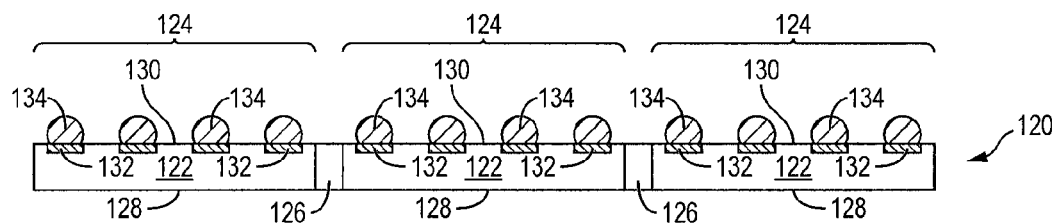

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded to contact pads 132. Bumps 134 represent one type of interconnect structure that can be formed over contact pads 132. The interconnect structure can also use stud bump, micro bump, or other electrical interconnect.

Figure 3C:
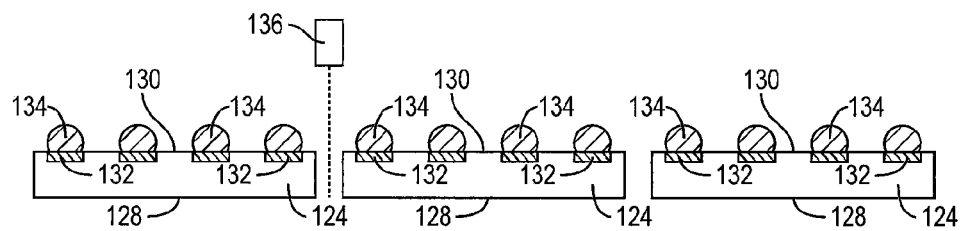

In FIG. 3c, semiconductor wafer 120 is singulated through saw street 126 using a saw blade or laser cutting tool 136 into individual semiconductor die 124.

Figure 4A:
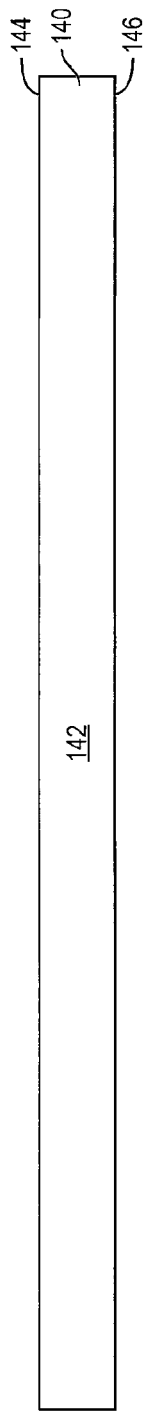
FIGS. 4a-4v illustrate a process of making a low profile semiconductor device including a dual-purpose shield and heat-dissipation structure with multiple vertically stacked semiconductor die.
Figure 4B:
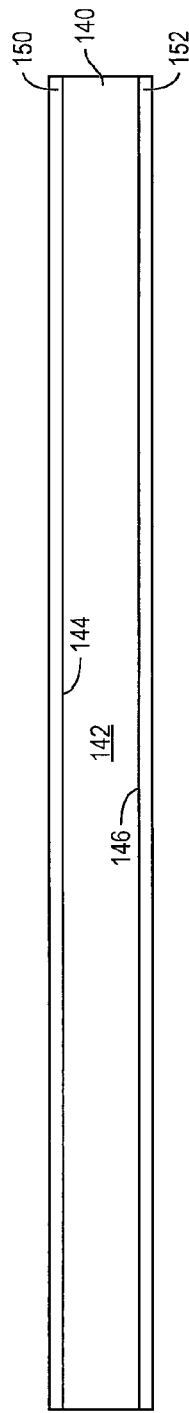
Figure 4C:
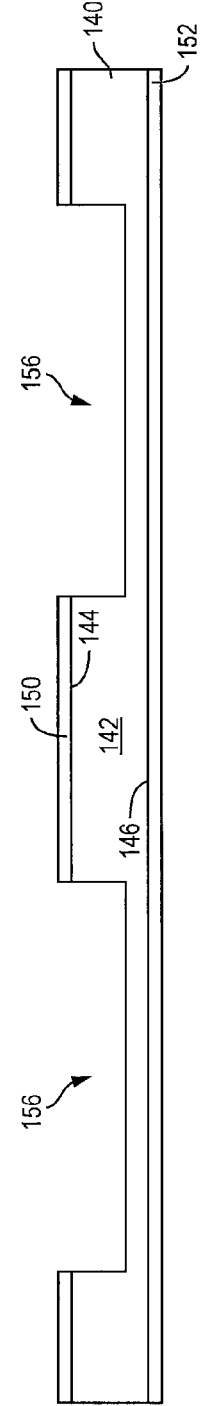
Figure 4D:
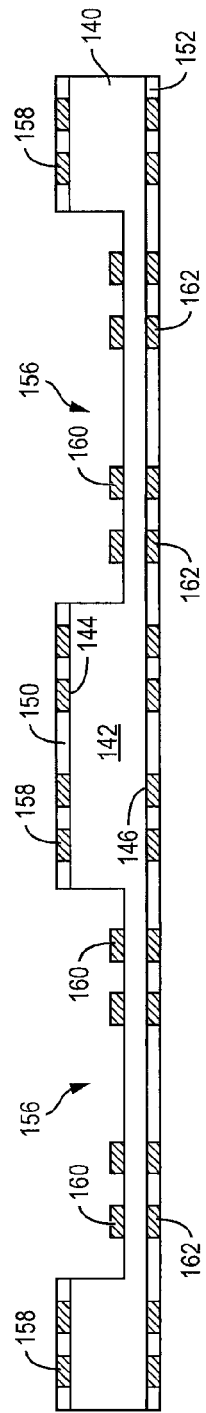
Figure 4E:
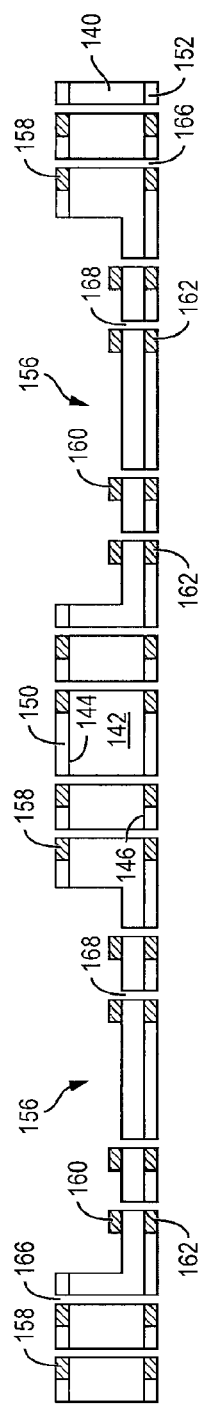
Figure 4F:
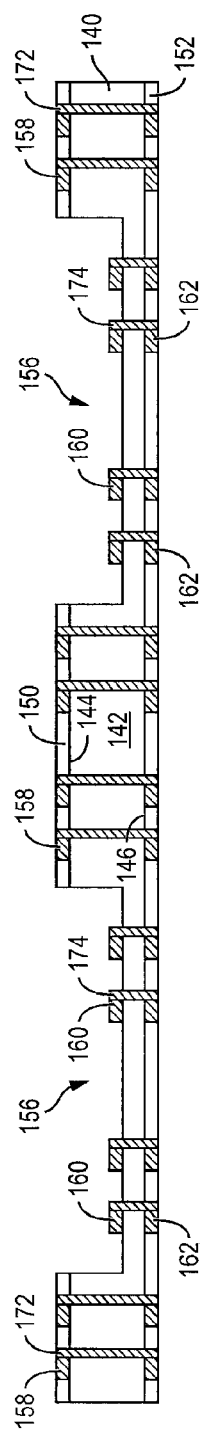
Figure 4G:
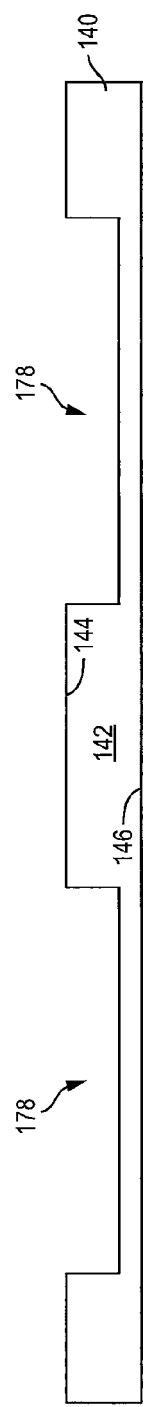
Figure 4H:
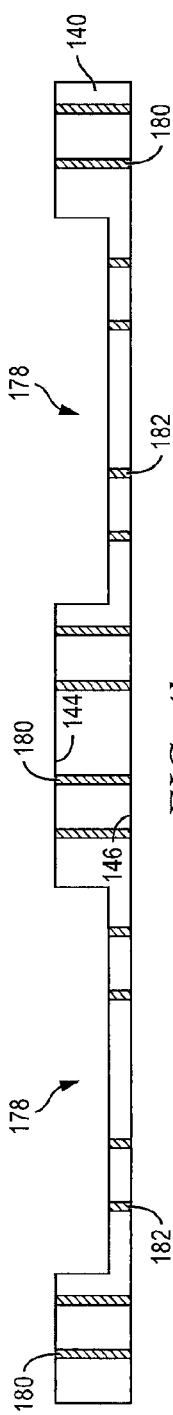
Figure 4I:
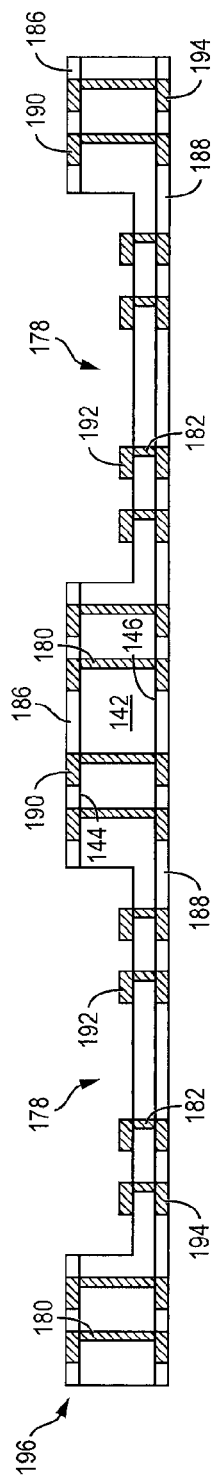
Figure 4J:
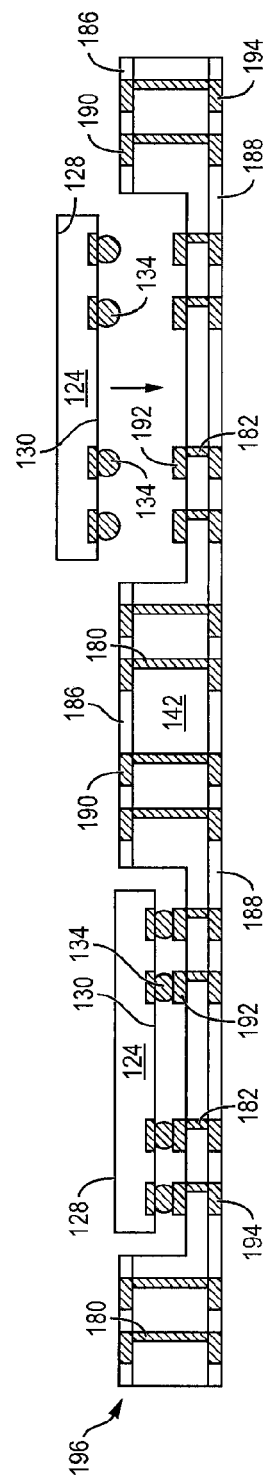
Figure 4K:
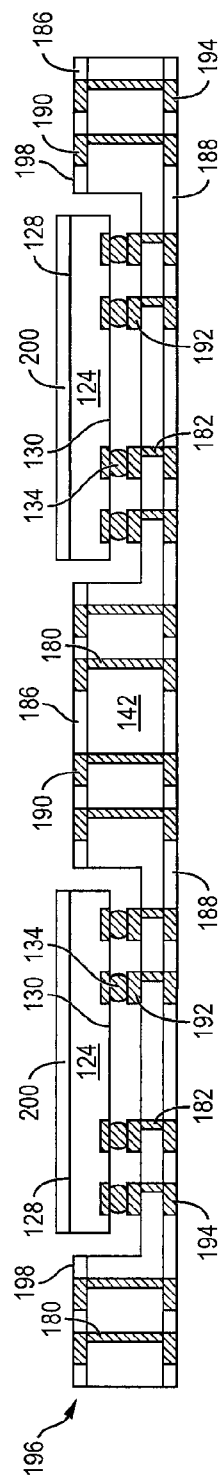
Figure 4L:
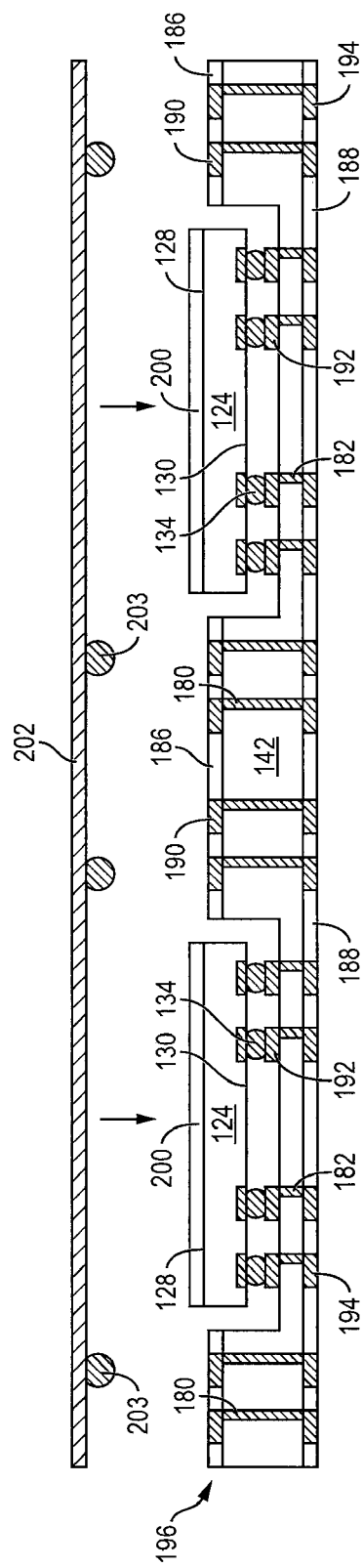
Figure 4M:
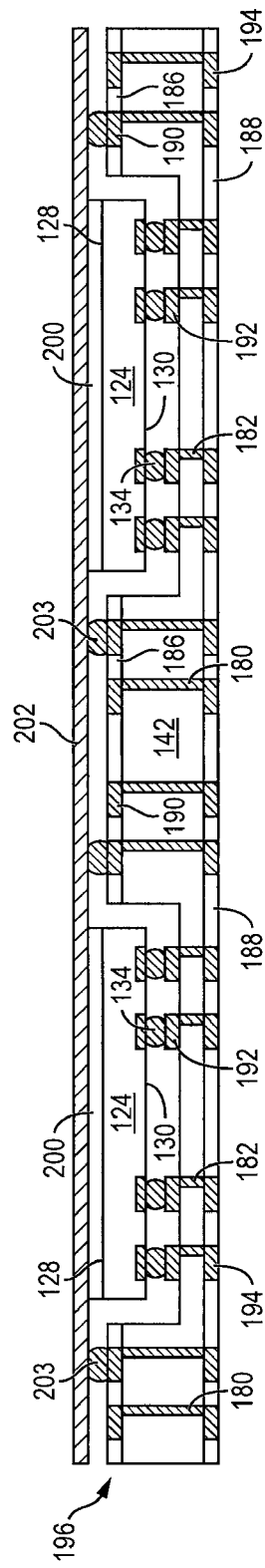
Figure 4P:
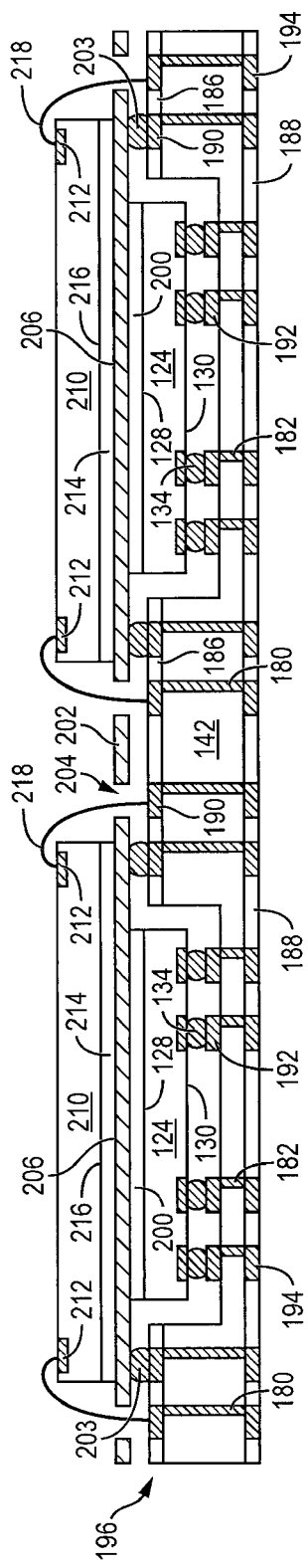
Figure 4Q:
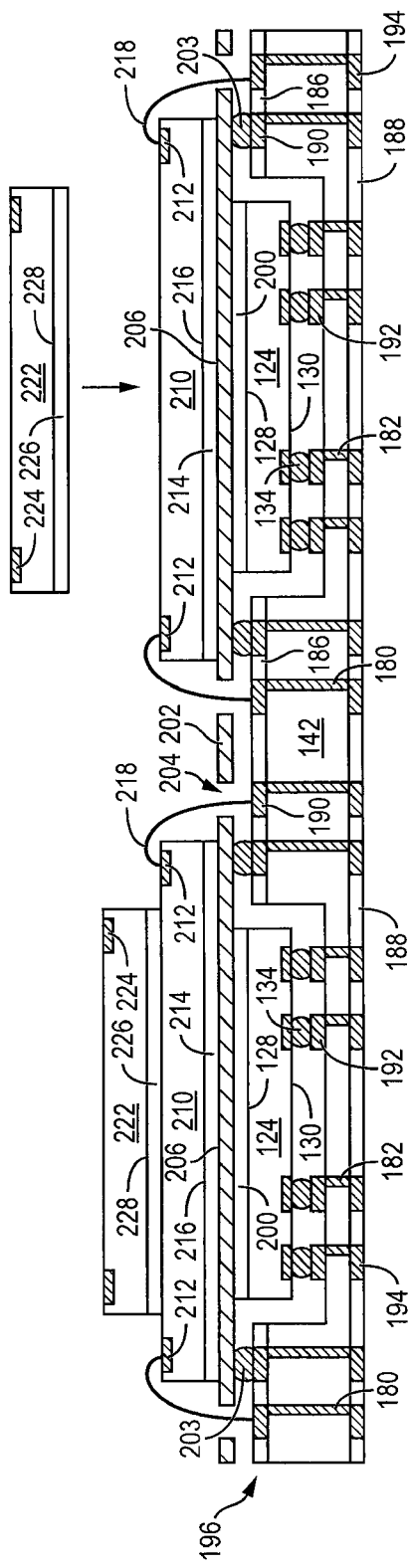
Figure 4R:
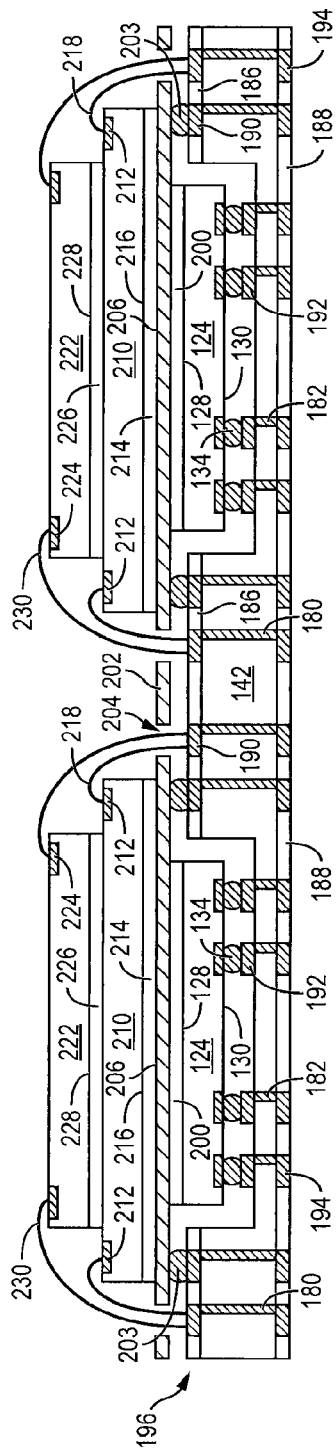
Figure 4S:
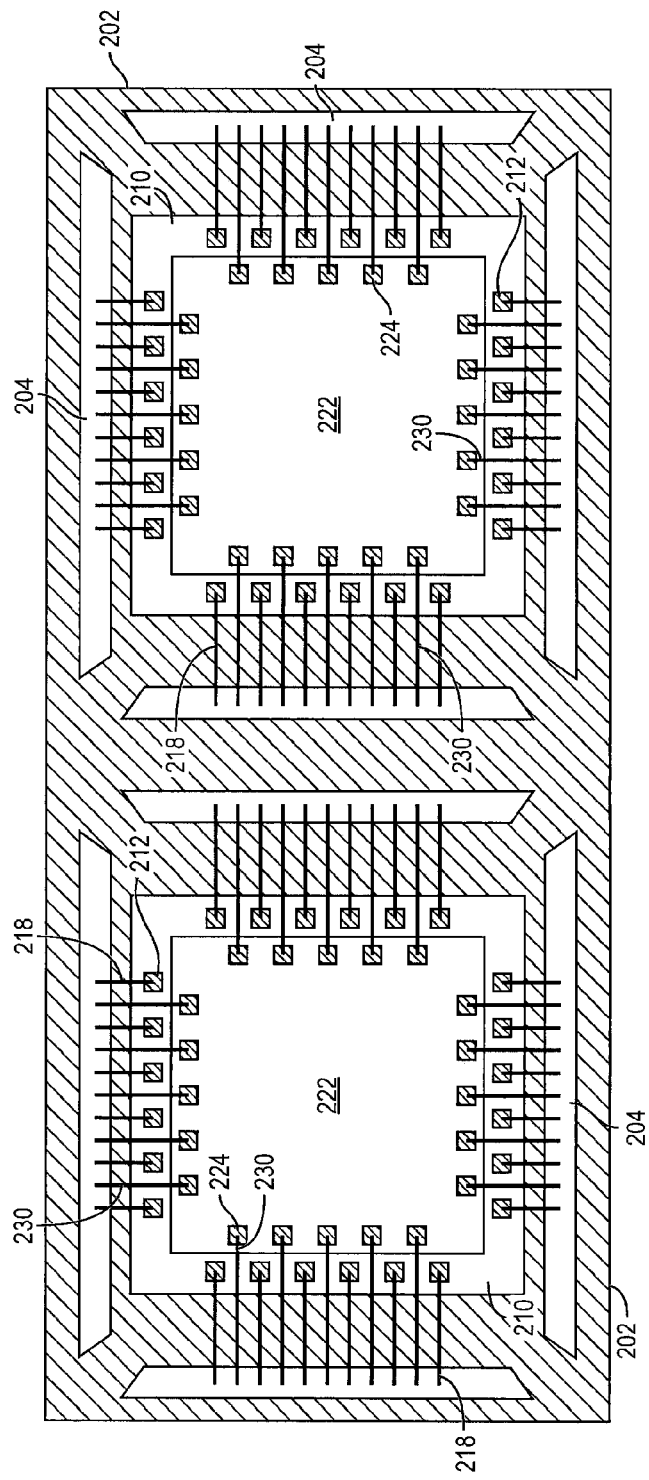
Figure 4T:
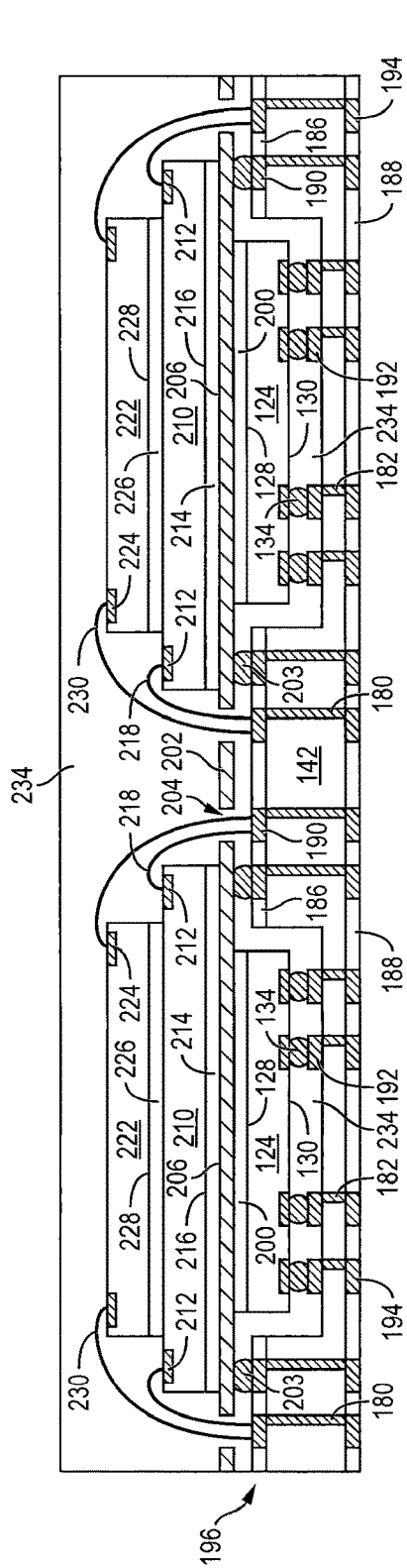
Figure 4U:
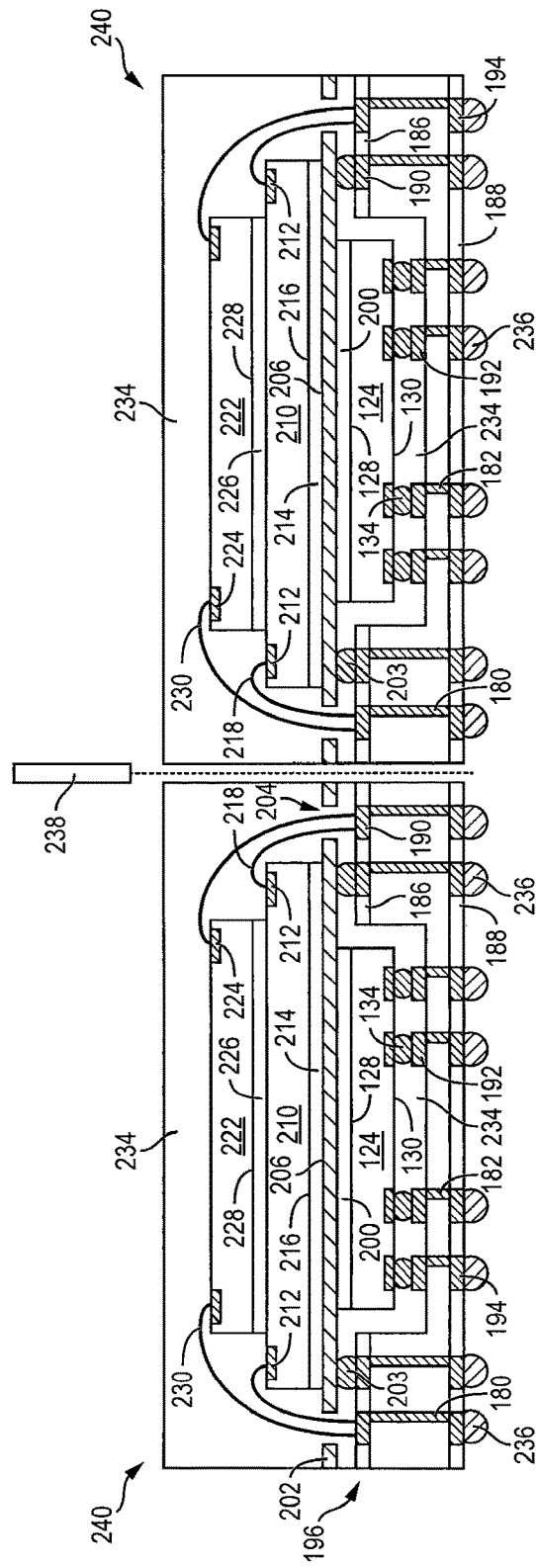
Figure 4V:
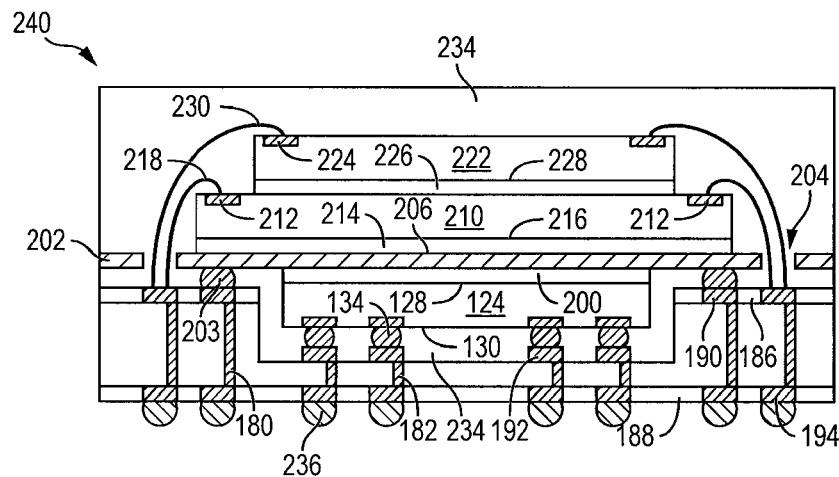

FIGS. 4a-4v illustrate, in relation to FIGS. 1 and 2a-2c, a process of forming a low profile semiconductor device including a dual-purpose shield and heat-dissipation structure with multiple vertically stacked semiconductor die. FIG. 4a shows a cross-sectional view of a portion of semiconductor wafer 140. Semiconductor wafer 140 includes a base substrate material 142, such as silicon, germanium, gallium arsenide, indium phosphide, or silicon carbide, for structural support. Semiconductor wafer 140 includes a first surface 144 and a second surface 146 opposite the first surface.

In FIG. 4b, an insulating or passivation layer 150 is formed over first surface 144 of substrate 140 using PVD, CVD, printing, spin coating, spray coating, sintering, or thermal oxidation. Similarly, an insulating or passivation layer 152 is formed over second surface 146 of substrate 140 using PVD, CVD, printing, spin coating, spray coating, sintering, or thermal oxidation. Insulating layers 150 and 152 contain one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

In FIG. 4c, a portion of insulating layer 150 and a portion of semiconductor wafer 140 are removed to form recesses or cavities 156. Recesses 156 extend from insulating layer 150, through first surface 144, and partially but not completely through semiconductor wafer 140. Recesses 156 have sufficient width and depth to contain later mounted semiconductor die.

In FIG. 4d, a portion of insulating layers 150 and 152 is removed by an etching process to expose first surface 144 and second surface 146, respectively. An electrically conductive layer or RDL 158 is formed over the exposed portion of first surface 144 of substrate 140. An electrically conductive layer or RDL 160 is formed over substrate 140 and within recesses 156. An electrically conductive layer or RDL 162 is formed over the exposed portion of second surface 146 of substrate 140. Conductive layers 158, 160, and 162 are formed using a patterning and metal deposition process such as printing, PVD, CVD, sputtering, electrolytic plating, and electroless plating. Conductive layers 158, 160, and 162 are one or more layers of Al, Cu, Sn, Ni, Au, Ag, or other suitable electrically conductive material. Conductive layers 158, 160, and 162 provide an electrical path for electrical interconnect of later mounted semiconductor die and are electrically common or electrically isolated depending on the design and function of the later mounted semiconductor die.

In FIG. 4e, a plurality of vias 166 is formed through substrate 140 using laser drilling, mechanical drilling, or deep reactive ion etching (DRIE). Vias 166 extend from insulating layer 150 and conductive layer 158, through semiconductor wafer 140, to insulating layer 152 and conductive layer 162. Similarly, a plurality of vias 168 is formed through substrate 140 using laser drilling, mechanical drilling, or DRIE. Vias 168 extend from openings 156 and conductive layer 160, through semiconductor wafer 140, to insulating layer 152 and conductive layer 162.

In FIG. 4f, vias 166 and 168 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical conductive vias 172 and 174, respectively. Conductive vias 172 provide electrical interconnect between conductive layers 158 and 162 through semiconductor wafer 140. Conductive vias 174 provide electrical interconnect between conductive layer 160, to which a later mounted semiconductor die is mounted, and further provide electrical interconnect through semiconductor wafer 140 to conductive layer 162.

FIGS. 4g-4i, continuing from FIG. 4a, show an alternate method of forming a substrate with recesses, conductive layers, and conductive vias similar to the substrate shown in FIG. 4f. In FIG. 4g, a portion of semiconductor wafer 140 is removed to form recesses or cavities 178. Recesses 178 extend from first surface 144, partially but not completely through semiconductor wafer 140. Recesses 178 have sufficient width and depth to contain later mounted semiconductor die.

In FIG. 4h, pluralities of conductive vias 180 and 182 are formed by creating openings through substrate 140 using laser drilling, mechanical drilling, or DRIE, and filling the openings with Al, Cu, Sn, Ni, Au, Ag, Ti, W, poly-silicon, or other suitable electrically conductive material using electrolytic plating, electroless plating process, or other suitable metal deposition process. Conductive vias 180 extend from first surface 144 of semiconductor wafer 140, through the semiconductor wafer, to second surface 146 of the semiconductor wafer. Conductive vias 180 provide electrical interconnect between first and second surfaces 144 and 146 of semiconductor wafer 140. Conductive vias 182 extend from openings 178, through semiconductor wafer 140, to second surface 146 of the semiconductor wafer. Conductive vias 182 provide electrical interconnect between later mounted semiconductor die that are mounted within recesses 178, and provide electrical interconnect through semiconductor wafer 140 to second surface 146 of the semiconductor wafer.

In FIG. 4i, an insulating or passivation layer 186 is formed over first surface 144 of substrate 140 and conductive vias 180 using PVD, CVD, printing, spin coating, spray coating, sintering or thermal oxidation. Similarly, an insulating or passivation layer 188 is formed over second surface 146 of substrate 140 and conductive vias 180 and 182 using PVD, CVD, printing, spin coating, spray coating, sintering, or thermal oxidation. Insulating layers 186 and 188 contain one or more layers of SiO2, Si3N4, SiON, Ta2O5, Al2O3, or other material having similar insulating and structural properties.

A portion of insulating layers 186 and 188 is removed by an etching process to expose first surface 144 and second surface 146 of semiconductor wafer 140, as well as to expose conductive vias 180 and 182. An electrically conductive layer or RDL 190 is formed over the exposed portion of first surface 144 of substrate 140. An electrically conductive layer or RDL 192 is formed over substrate 140, over conductive vias 182, and within recesses 178. An electrically conductive layer or RDL 194 is formed over the exposed portion of second surface 146 of substrate 140 and over conductive vias 180 and 182. Conductive layers 190, 192, and 194 are formed using a patterning and metal deposition process such as printing, PVD, CVD, sputtering, electrolytic plating, and electroless plating. Conductive layers 190, 192, and 194 include one or more layers of Al, Cu, Sn, Ni, Au, Ag, or other suitable electrically conductive material. Conductive layers 190, 192, and 194 provide an electrical path for the electrical interconnect of later mounted semiconductor die and are electrically common or electrically isolated depending on the design and function of the later mounted semiconductor die. In one embodiment, conductive layers 190, 192, and 194 are formed at a same time as conductive vias 180 and 182 such that the conductive layers and conductive vias are formed by the same metal deposition process. The resulting wafer-form substrate 196 provides electrical interconnect vertically and laterally across the substrate.

In FIG. 4*j*, continuing from FIG. 4*i* or FIG. 4*f*, semiconductor die 124 from FIGS. 3*a*-3*c* are positioned over recesses 178 and conductive layer 192 with active surface 130 oriented toward substrate 196.

FIG. 4*k* shows semiconductor die 124 are mounted to conductive layer 192 and within recesses 178, as part of a reconstituted or reconfigured wafer level package. The back surface 128 of semiconductor die 124 is disposed at a level that is substantially coplanar with an upper surface 198 of substrate 196. Alternatively, back surface 128 of semiconductor die 124 is disposed at a level that is vertically offset from upper surface 198 of substrate 196 such that semiconductor die 124 is completely contained within recess 178, or conversely, semiconductor die 124 protrudes outside of recess 178 and above upper surface 198 of substrate 196. By mounting semiconductor die 124 within recesses 178, a height of semiconductor die 124 extending above substrate 196 is reduced, and overall package height or package profile is also reduced.

A thermal interface material (TIM) 200 such as thermal epoxy, thermal epoxy resin, thermal conductive paste, aluminum oxide, zinc oxide, boron nitride, pulverized silver, or thermal grease is deposited on, and completely covers, back surface 128 of semiconductor die 124.

In FIG. 4*l*, a dual-purpose heat spreader and shielding layer 202 is positioned over semiconductor die 124 and substrate 196. Heat spreader 202 has a footprint that is larger than a footprint of recess 178 such that the heat spreader extends to a perimeter or an edge of substrate 196 for increased shielding and heat dissipation. Heat spreader 202 is Cu, Al, stainless steel, nickel silver, low-carbon steel, or other metal and composite with high thermal conductivity capable of blocking or absorbing EMI, RFI, harmonic distortion, and other inter-device interference. Heat spreader 202 is configured to aid with distribution and dissipation of heat generated by semiconductor die 124 and increase thermal performance of the semiconductor package. Heat spreader 202 is planar in shape, making the heat spreader simple to make relative to heat spreaders and shielding layers including non-planar configurations. The planar shape of heat spreader 202 results in a final semiconductor package that has a reduced height and smaller vertical profile than packages including non-planar heat spreaders and shielding layers formed over the package substrate.

Heat spreader 202 includes an electrically conductive bump material deposited over a surface of the heat spreader using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to heat spreader 202 using a suitable attachment or bonding process. In one embodiment, the bump material is reflowed by heating the material above its melting point to form spherical balls or bumps 203. In some applications, bumps 203 are reflowed a second time to improve electrical contact to heat spreader 202. The bumps can also be compression bonded to heat spreader 202. Bumps 203 represent one type of interconnect structure that can be formed over heat spreader 202. The interconnect structure can also use stud bump, micro bump, or other electrical interconnect. In another embodiment, bumps 203 are formed over substrate 196 and are bonded to conductive layer 190, rather than over heat spreader 202 before heat spreader 202 is connected to substrate 196 with bumps 203.

In FIG. 4*m*, heat spreader 202 contacts TIM 200, and is connected to substrate 196 with bumps 203. TIM 200 and heat spreader 202 form a thermally conductive path that aids with distribution and dissipation of heat generated by semiconductor die 124 to increase thermal performance of the semiconductor package. Heat spreader 202 is electrically and thermally connected to an external low-impedance ground point through bumps 203, conductive via 180, and conductive layers 190 and 194. While FIGS. 4*k* and 4*l* show TIM 200 is initially disposed on back surface 128 of semiconductor die 124, alternatively, TIM 200 can be disposed on heat spreader 202 rather than the back surface of the semiconductor die before mounting the heat spreader to the semiconductor die and substrate 196.

Mounting heat spreader 202 over substrate 196, for inclusion within a dual-purpose shielding and heat-dissipation package, can result in subsequent delamination between the heat spreader and the dual-purpose shielding and heat-dissipation package. Delamination occurs, for example, during moisture resistance tests (MRT) due to impurities on surfaces of heat spreader 202. To reduce a risk of delamination, impurities from the surfaces of the heat spreader 202 are removed by a plasma treatment or other suitable process. In one embodiment, the plasma treatment is performed before heat spreader 202 is mounted to substrate 196 with bumps 203. The plasma treatment, in addition to removing impurities from the surfaces of the heat spreader 202, also roughens treated surfaces of the heat spreader. The additional roughness increases bond strength between the heat spreader and the dual-purpose shielding and heat-dissipation package, including a later formed encapsulant material, thereby reducing the risk of delamination.

FIG. 4*n* shows a top plan view of the heat spreader 202 previously presented in cross-sectional view in FIG. 4*m*. FIG. 4*n* shows heat spreader 202 includes openings 204 formed through the heat spreader. Openings 204 are aligned over conductive layer 190 and are of sufficient size to allow for the passage of bond wires from over a first surface of the heat spreader 202 to over a second surface of the heat spreader opposite the first surface. Openings 204 are depicted as rectangular or polyhedronal shapes but can also be formed as any shape, including shapes with parallel, curved, or rounded sides. Accordingly, openings 204 are configured to facilitate electrical connections between the opposing first and second surfaces of heat spreader 202 while providing an increased surface area of the heat spreader. Rather than forming electrical connections outside or around a perimeter of a heat spreader, formation of openings 204 through heat spreader 202 provides a peripheral portion or overhang 205 that extends to an edge of substrate 196 for increased shielding and heat dissipation. The inclusion of openings 204 and peripheral portion 205 provides heat spreader 202 with increased surface area relative to heat spreaders that form bond wires around an outer edge of the heat spreader. Furthermore, openings 204 are positioned within heat spreader 202 such that a center portion 206 of the heat spreader includes an area sufficiently large to facilitate the subsequent mounting of semiconductor die. By forming heat spreader 202 with openings 204, peripheral portion 205, and center portion 206, more semiconductor die, including larger semiconductor die and stacks of semiconductor die, can be mounted to the heat spreader than can be mounted to other heat spreaders that include wire bonds formed outside or around a perimeter of the heat spreader.

In FIG. 4o, semiconductor die 210 with contact pads 212, similar to semiconductor die 124 with contact pads 132 from FIGS. 3a-3c, are positioned over center portion 206 of heat spreader 202. An adhesive 214 is disposed over back surface 216 of semiconductor die 210 opposite contact pads 212. Adhesive 214 includes a die attach adhesive, epoxy, or other adhesive material and is oriented toward center portion 206 of heat spreader 202.

FIG. 4p shows semiconductor die 210 is mounted to center portion 206 of heat spreader 202 between openings 204 with adhesive 214. Because adhesive 214 is disposed between back surface 216 of semiconductor die 210 and heat spreader 202, adhesive 214 also includes a TIM that forms a thermally conductive path that aids with distribution and dissipation of heat generated by semiconductor die 210, further increasing thermal performance of the semiconductor package. While FIG. 4o shows adhesive 214 is initially disposed on back surface 216 of semiconductor die 210, alternatively, adhesive 214 is disposed on heat spreader 202 before mounting the semiconductor die to the heat spreader.

FIG. 4p further shows bond wires 218 are formed between contact pads 212 on semiconductor die 210, and conductive layer 190 to electrically connect the semiconductor die to substrate 196. Bond wires 218 pass through openings 204 in heat spreader 202 which permits semiconductor die 210 to be electrically connected to substrate 196, and further permits heat spreader 202 to extend to an edge of the substrate. Thus, openings 204 facilitate the use of bond wires 218 as a low-cost, stable technology for forming electrical connections and increase the shielding and thermal performance of heat spreader 202.

In FIG. 4q, semiconductor die 222 with contact pads 224, similar to semiconductor die 210 with contact pads 212 from FIG. 4o, are positioned over semiconductor die 210. An adhesive 226 is disposed over a back surface 228 of semiconductor die 222 opposite contact pads 224. Adhesive 226 includes a die attach adhesive, epoxy, or other adhesive material and is oriented toward an active surface of semiconductor die 210.

FIG. 4r shows semiconductor die 222 mounted to semiconductor die 210, and over center portion 206 of heat spreader 202 with adhesive 226. While FIG. 4q shows adhesive 226 is initially disposed on back surface 228 of semiconductor die 222, adhesive 226 can also be disposed on semiconductor die 210 before mounting semiconductor die 222 to semiconductor die 210, rather than on back surface 228 of semiconductor die 222.

FIG. 4r further shows bond wires 230 are formed between contact pads 224 of semiconductor die 222 and conductive layer 190 to electrically connect the semiconductor die to substrate 196. Bond wires 230 pass through openings 204 in heat spreader 202 to electrically connect semiconductor die 222 to substrate 196 while permitting heat spreader 202 to extend to an edge of the substrate. Thus, openings 204 facilitate the use of bond wires 230 as a low-cost, stable technology for forming the electrical connection between semiconductor die 222 and substrate 196.

FIG. 4s shows a top plan view of semiconductor die 210 and 222 mounted over heat spreader 202, as previously presented in cross-sectional view in FIG. 4r. FIG. 4s shows heat spreader 202 includes openings 204 formed through the heat spreader. Openings 204 are aligned over conductive layer 190 and are of sufficient size to allow for the passage of bond wires 218 and 230 from contact pads 212 and 224, respectively, to conductive layer 190 of substrate 196. Accordingly, openings 204 facilitate electrical connection between opposing first and second surfaces of heat spreader 202 while providing an increased surface area of the heat spreader. Rather than forming electrical connections outside or around a perimeter of a heat spreader, by forming openings 204 through heat spreader 202, the heat spreader extends to an edge of substrate 196 for increased shielding and heat dissipation.

In FIG. 4t, an encapsulant or molding compound 234 is deposited over substrate 196, within recesses 178, around heat spreader 202, around semiconductor die 124, 210, and 222, and around bond wires 218 and 230 using a paste printing, compressive molding, transfer molding, liquid encapsulant molding, vacuum lamination, spin coating, or other suitable applicator. Encapsulant 234 can be polymer composite material, such as epoxy resin with filler, epoxy acrylate with filler, or polymer with proper filler. The viscosity of encapsulant 234 is selected for uniform coverage, e.g., a lower viscosity increases the flow of the encapsulant. Encapsulant 234 is non-conductive and environmentally protects the semiconductor device from external elements and contaminants. Because heat spreader 202 includes a clean roughened surface from the plasma treatment, a strong bond exists between encapsulant 234 and the heat spreader to reduce the risk of delamination.

In FIG. 4u, an electrically conductive bump material is deposited over conductive layer 194 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 194 using a suitable attachment or bonding process. In one embodiment, the bump material is reflowed by heating the material above its melting point to form balls or bumps 236. In some applications, bumps 236 are reflowed a second time to improve electrical contact to conductive layer 194. Bumps 236 can also be compression bonded to conductive layer 194. Bumps 236 represent one type of interconnect structure that can be formed over conductive layer 194. The interconnect structure can also use stud bump, micro bump, or other electrical interconnect.

FIG. 4u also shows the reconstituted or reconfigured wafer level package in FIG. 4u is singulated through encapsulant 234, heat spreader 202, and substrate 196 with saw blade or laser cutting tool 238 into individual low profile dual-purpose shielding and heat-dissipation packages 240 with multiple vertically stacked semiconductor die.

FIG. 4v shows low profile dual-purpose shielding and heat-dissipation package 240 after singulation. Heat spreader 202 is electrically and thermally connected to an external low-impedance ground point through bumps 203, conductive via 180, and conductive layers 190 and 194. A number of conductive vias 180 are electrically connected to conductive layers 190 and 194 for electrical interconnect among semiconductor die 124, 210, and 222. Other conductive vias 180 are connected to an external low-impedance ground point, as well as being electrically and thermally connected to heat spreader 202.

By mounting semiconductor die 124 within recesses 178, a height of semiconductor die 124 extending above substrate 196 is reduced, and the overall profile of dual-purpose shielding and heat-dissipation package 240 is also reduced. The planar shape of heat spreader 202, in addition to reducing the package profile, is also simpler to make than non-planar heat spreaders, thereby reducing manufacturing difficulty and cost. Furthermore, openings 204 within heat spreader 202 allow for bond wires 218 and 230 to electrically connect semiconductor die 124, 210, 222, and substrate 196 on opposing sides of the heat spreader. By forming heat spreader 202 to include openings 204, peripheral portion 205, and center portion 206, more semiconductor die, including larger semiconductor die and stacks of semiconductor die, can be mounted to the heat spreader than can be mounted to other heat spreaders that include wire bonds formed outside or around a perimeter of the heat spreader. Additionally, to reduce a risk of delamination between heat spreader 202 and dual-purpose shielding and heat-dissipation package 240, a plasma treatment removes impurities from surfaces of the heat spreader and roughens the treated surfaces of the heat spreader. The roughened surfaces and removal of impurities increase bond strength between heat spreader 202 and the dual-purpose shielding and heat-dissipation package 240, thereby reducing the risk of delamination.

Figure 5A:
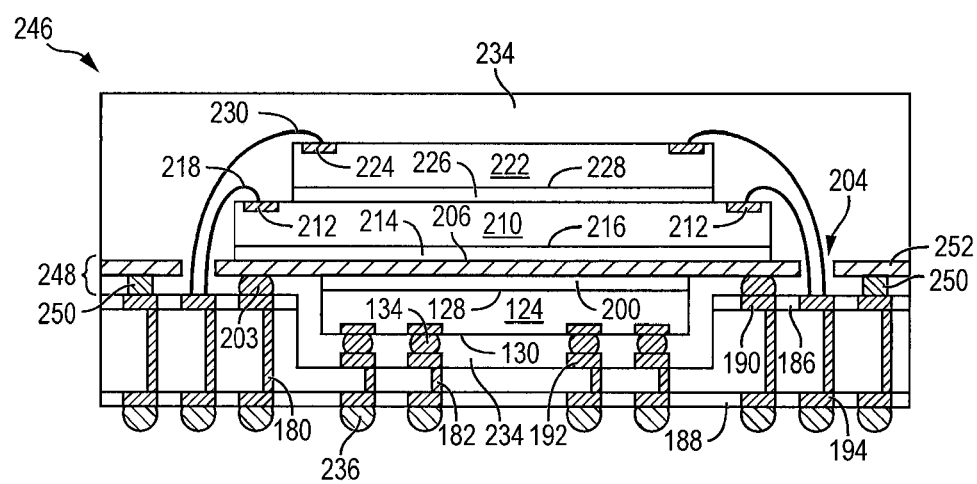
FIGS. 5a-5b illustrate a low profile semiconductor device including a dual-purpose shield and heat-dissipation structure with supports and multiple vertically stacked semiconductor die.

FIG. 5a illustrates another embodiment of a dual-purpose shielding and heat-dissipation package 246 similar to package 240 from FIG. 4v. Package 246 includes a heat spreader and shielding layer 248 mounted over semiconductor die 124 and substrate 196 similar to heat spreader 202 from package 240. Heat spreader 248 is Cu, Al, stainless steel, nickel silver, low-carbon steel, or other metal and composite with high thermal conductivity capable of blocking or absorbing EMI, RFI, harmonic distortion, and other inter-device interference. Heat spreader 248 is configured to aid with distribution and dissipation of heat generated by semiconductor die 124, semiconductor die 210, and to increase thermal performance of package 246. Heat spreader 248 is substantially planar in shape, and differs from heat spreader 202 by the inclusion of a support structure or metal protrusions 250. Support structure 250 can be made as an integral portion of heat spreader 248, or alternatively, the support structure can be made as a discrete feature that is subsequently attached to the heat spreader. Support structure 250 extends orthogonally from a top planar portion 252 of heat spreader 248 and contacts conductive layer 190 in a periphery of substrate 296 to provide additional structural support, thermal conduction, and electrical grounding for package 246. Alternatively, support structure 250 is angled or slanted rather than orthogonal with respect to planar portion 252. The height or vertical offset of support structure 250 is substantially equal to a height of conductive bump 203 such that the shape of heat spreader 248 results in a final semiconductor package that has a reduced height and smaller vertical profile than conventional packages. The vertical profile of package 246 is further reduced because semiconductor die 124 is mounted within recess 178.

Figure 5B:
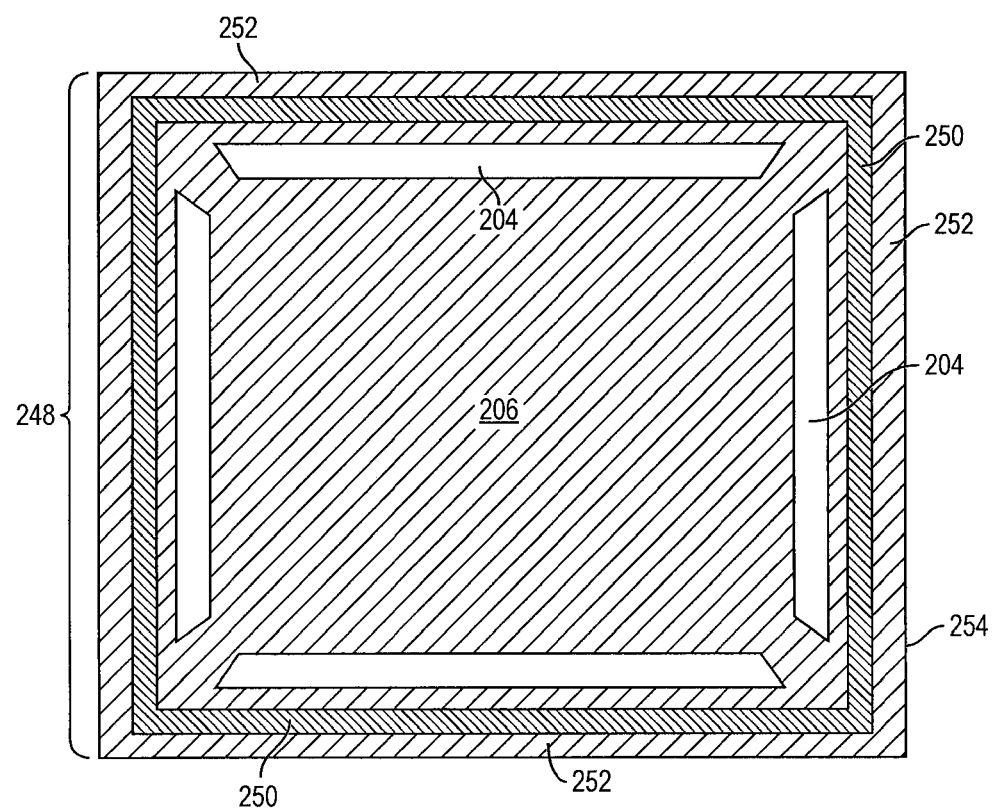

FIG. 5b shows a top plan view of heat spreader 248 previously presented in cross-sectional view in FIG. 5a. FIG. 5b shows heat spreader 248 includes planar portion 252 and support structure 250 that is connected to and extends vertically from planar portion 252. Support structure 250 is located near an outer edge or periphery 254 of planar portion 252 such that the support structure is positioned between outer edge 254 and openings 204. Alternatively, openings 204 can be positioned between outer edge 254 and support structure 250. In another embodiment, support structure 250 is coterminous with and extends from outer edge 254 of planar portion 252. The plan view of FIG. 5b further shows support structure 250 is continuous and that the support structure is concentric with respect to outer edge 254. Alternatively, support structure 250 can include a plurality of discrete portions such that gaps exist between the discrete portions of the support structure. Support structure 250 is depicted as a rectangular or polyhedronal shape but can also be formed as any shape, including shapes with parallel, curved, or rounded sides.

FIG. 5b further shows openings 204 are aligned over conductive layer 190 and are of sufficient size to allow for the passage of bond wires from over a first surface of heat spreader 248 to over a second surface of the heat spreader opposite the first surface. Accordingly, openings 204 are configured to facilitate electrical connections between the opposing first and second surfaces of heat spreader 248 while providing an increased surface area of the heat spreader.

Figure 6A:
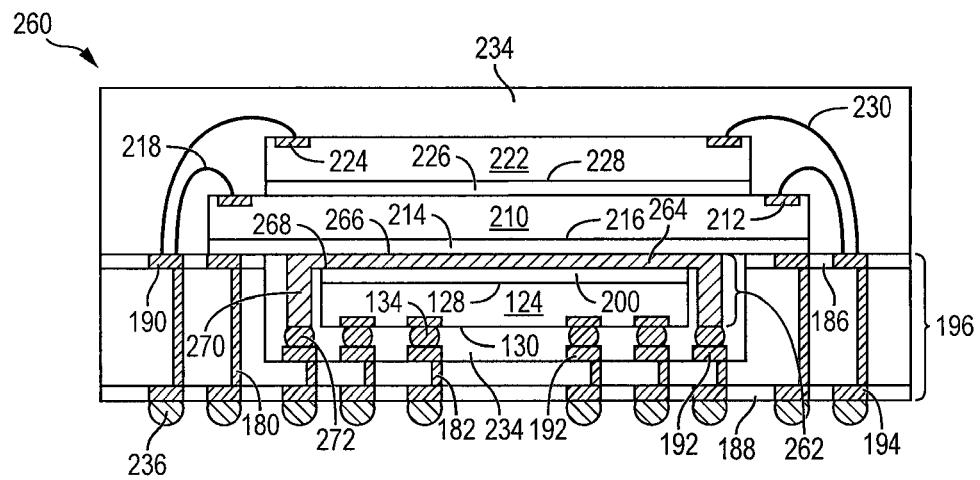
FIGS. 6a-6b illustrate another embodiment of a low profile semiconductor device including a dual-purpose shield and heat-dissipation structure with supports and multiple vertically stacked semiconductor die.

FIG. 6a illustrates another embodiment of a low profile dual-purpose shielding and heat-dissipation package 260 similar to package 246 from FIG. 5a. Package 260 includes a dual-purpose heat spreader and shielding layer 262 similar to heat spreader 248 from package 246. Heat spreader 262 is mounted over substrate 196, and differs from heat spreader 248 by being mounted within, rather than over, cavity 178. Accordingly, heat spreader 262 has a footprint that is smaller than a footprint of recess 178 but is greater than a footprint of semiconductor die 124. Heat spreader 262 is Cu, Al, stainless steel, nickel silver, low-carbon steel, or other metal and composite with high thermal conductivity capable of blocking or absorbing EMI, RFI, harmonic distortion, and other inter-device interference.

Heat spreader 262 includes a planar portion 264 and a support structure or metal protrusions 270. Planar portion 264 includes a first surface 266 that is co-planar with a surface of substrate 196. Planar portion 264 has a footprint that is smaller than a footprint of semiconductor die 210. Accordingly, semiconductor die 210 is disposed over recess 178 and is mounted to both substrate 196 and to first surface 266 of heat spreader 262 with adhesive 214. Planar portion 264 further includes a second surface 268 disposed opposite the first surface 266 and connected to semiconductor die 124 with TIM 200. Support structure 270 can be made as an integral portion of heat spreader 262, or alternatively, the support structure can be made as a discrete feature that is subsequently attached to the heat spreader. Support structure 270 of heat spreader 262 extends orthogonally from planar portion 264 and is disposed around semiconductor die 124. Alternatively, support structure 270 is angled or slanted rather than orthogonal with respect to top planar portion 264. Support structure 270 also extends vertically from planar portion 264 and is mounted to conductive layer 192 of substrate 196 with bumps 272. Bumps 272 are formed by depositing an electrically conductive bump material over conductive layer 192 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 192 using a suitable attachment or bonding process. In one embodiment, the bump material is reflowed by heating the material above its melting point to form balls or bumps 272. In some applications, bumps 272 are reflowed a second time to improve electrical contact to conductive layer 192. Bumps 272 can also be compression bonded to conductive layer 192. Bumps 272 represent one type of interconnect structure that can be formed over conductive layer 192. The interconnect structure can also use stud bump, micro bump, or other electrical interconnect.

Figure 6B:
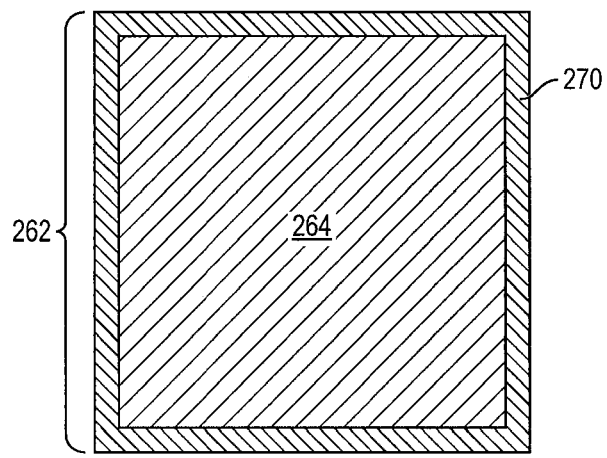

FIG. 6b shows a top plan view of heat spreader 262 previously presented in cross-sectional view in FIG. 6a. FIG. 6b shows heat spreader 262 includes planar portion 264 and support structure 270 that is connected to and extends vertically from planar portion 264. Support structure 270 is located near an outer edge or periphery of planar portion 264 such that in one embodiment the support structure is coterminous with and extends from outer edge of planar portion 264. The plan view of FIG. 6b further shows support structure 270 is continuous such that the support structure is concentric with respect to opening 178 and surrounds a perimeter of semiconductor die 124 after the heat spreader is mounted to conductive layer 192 of substrate 196 with bumps 272. Alternatively, support structure 270 can include a plurality of discrete portions surrounding a perimeter of semiconductor die 124 such that gaps exist between the discrete portions of the support structure. Support structure 270 is depicted as a rectangular or polyhedronal shape but can also be formed as any shape, including shapes with parallel, curved, or rounded sides.

Heat spreader 262 aids with distribution and dissipation of heat generated by semiconductor die 124, semiconductor die 210, and increases thermal performance of package 260. Thermal energy passes from semiconductor die 124 and 210 to heat spreader 262 through TIM 200 and adhesive 214, respectively. From heat spreader 262, heat is conducted through bumps 272, conductive layer 192, conductive vias 182, conductive layer 194, and bumps 236 to an external low-impedance ground point. By mounting heat spreader 262 to substrate 196 within recess 178, the height or vertical offset of support structure 270 is contained within a depth of recess 178, resulting in a final package 260 that has a reduced height and smaller vertical profile than conventional packages.

Figure 7A:
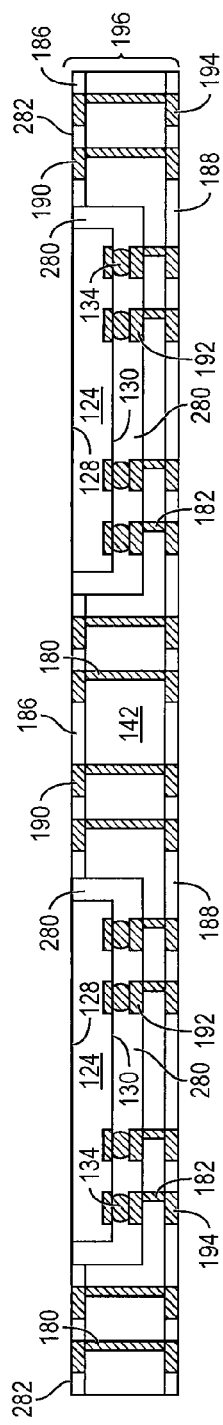
FIGS. 7a-7n illustrate another process of making a low profile semiconductor device including a dual-purpose shield and heat-dissipation structure and multiple vertically stacked semiconductor die.

FIGS. 7a-7n illustrate another embodiment of a process of making a low profile semiconductor device including a dual-purpose shield and heat-dissipation structure with multiple vertically stacked semiconductor die. In FIG. 7a, continuing from FIG. 4j, semiconductor die 124 are mounted to conductive layer 192 and within recesses 178, as part of a reconstituted or reconfigured wafer level package. The back surface 128 of semiconductor die 124 is disposed at a level that is substantially coplanar with an upper surface 282 of substrate 196. Alternatively, back surface 128 of semiconductor die 124 is disposed at a level that is vertically offset from upper surface 282 of substrate 196 such that semiconductor die 124 is completely contained within recess 178, or conversely, the semiconductor die protrudes outside of the recess and beyond upper surface 282 of substrate 196. By mounting semiconductor die 124 within recesses 178, a height of semiconductor die 124 extending above upper surface 282 of substrate 196 is reduced, and overall package height or package profile is also reduced.

An encapsulant or molding compound 280 is deposited within recesses 178, around semiconductor die 124, and around bumps 134 using a paste printing, compressive molding, transfer molding, liquid encapsulant molding, vacuum lamination, spin coating, or other suitable applicator. Encapsulant 280 can be polymer composite material, such as epoxy resin with filler, epoxy acrylate with filler, or polymer with proper filler. The viscosity of encapsulant 280 is selected for uniform coverage, e.g., a lower viscosity increases the flow of the encapsulant. Encapsulant 280 is non-conductive and environmentally protects the semiconductor device from external elements and contaminants.

Figure 7B:
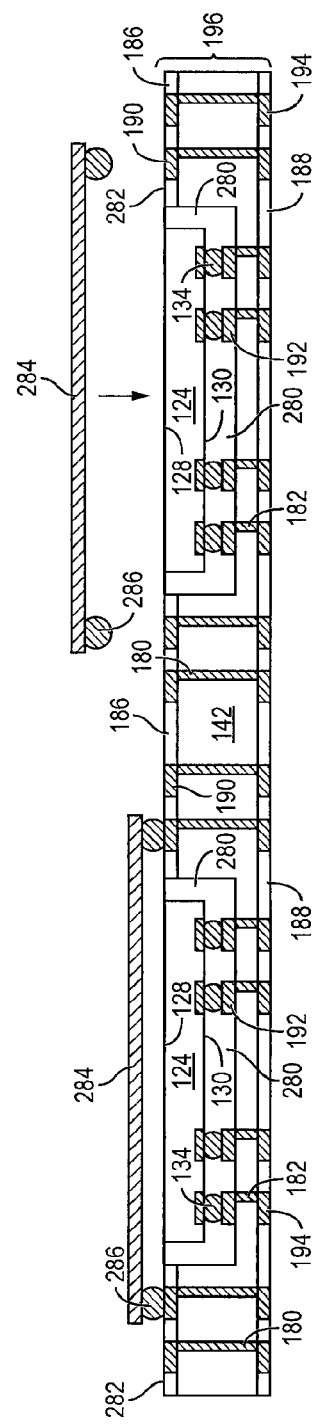

In FIG. 7b, a dual-purpose heat spreader and shielding layer 284, similar to heat spreader 202 from FIG. 4l, is positioned over semiconductor die 124 and substrate 196. Heat spreader 284 has a footprint that is larger than a footprint of recess 178. Heat spreader 284 is Cu, Al, stainless steel, nickel silver, low-carbon steel, or other metal and composite with high thermal conductivity capable of blocking or absorbing EMI, RFI, harmonic distortion, and other inter-device interference. Heat spreader 284 is configured to aid with distribution and dissipation of heat generated by semiconductor die and increase thermal performance of the semiconductor package. Heat spreader 284 is planar in shape, making the heat spreader simple to make relative to heat spreaders and shielding layers including non-planar configurations. The planar shape of heat spreader 284 results in a final semiconductor package that has a reduced height and smaller vertical profile than packages including non-planar heat spreaders and shielding layers formed over the package substrate.

Heat spreader 284 includes an electrically conductive bump material deposited over a surface of the heat spreader using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to heat spreader 284 using a suitable attachment or bonding process. In one embodiment, the bump material is reflowed by heating the material above its melting point to form spherical balls or bumps 286. In some applications, bumps 286 are reflowed a second time to improve electrical contact to heat spreader 284. The bumps can also be compression bonded to heat spreader 284. Bumps 286 represent one type of interconnect structure that can be formed over heat spreader 284. The interconnect structure can also use stud bump, micro bump, or other electrical interconnect. In another embodiment, bumps 286 are formed over substrate 196 and are bonded to conductive layer 190, rather than over heat spreader 284, before heat spreader 284 is connected to substrate 196 with bumps 286.

Figure 7C:
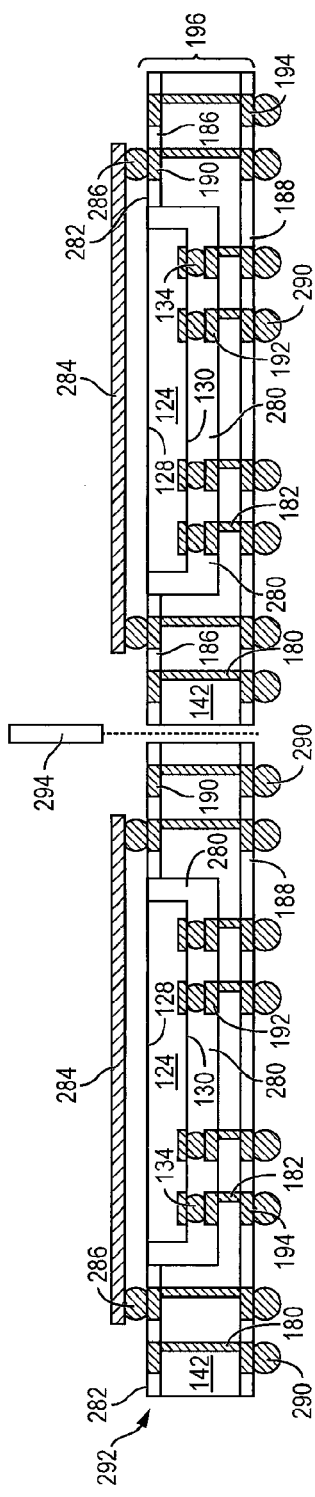

In FIG. 7c, an electrically conductive bump material is deposited over conductive layer 194 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 194 using a suitable attachment or bonding process. In one embodiment, the bump material is reflowed by heating the material above its melting point to form balls or bumps 290. In some applications, bumps 290 are reflowed a second time to improve electrical contact to conductive layer 194. Bumps 290 can also be compression bonded to conductive layer 194. Bumps 290 represent one type of interconnect structure that can be formed over conductive layer 194. The interconnect structure can also use stud bump, micro bump, or other electrical interconnect. Bumps 290 provide electrical and thermal interconnection between semiconductor devices 292 and points external to the package.

FIG. 7c further shows semiconductor devices 292 are singulated through substrate 196 with saw blade or laser cutting tool 294 into individual semiconductor devices 292 for subsequent mounting with other semiconductor devices.

In FIGS. 7d-7k, steps in a method of forming a semiconductor device for interconnection with semiconductor device 292 from FIG. 7c are shown. In FIG. 7d, a temporary substrate or carrier 300 contains sacrificial base material such as silicon, polymer, beryllium oxide, or other suitable low-cost, rigid material for structural support.

An interface layer or double-sided tape 302 is formed over carrier 300 as a temporary adhesive bonding film or etch-stop layer. A semiconductor wafer or substrate 304 contains a base material, such as silicon, germanium, gallium arsenide, indium phosphide, or silicon carbide, for structural support. As a semiconductor wafer, substrate 304 can contain embedded semiconductor die or passive devices. Substrate 304 can also be a multi-layer flexible laminate, ceramic, or leadframe. Substrate 304 is mounted to interface layer 302 over carrier 300.

In FIG. 7e, a plurality of vias is formed through substrate 304 using laser drilling, mechanical drilling, or DRIE. The vias are filled with Al, Cu, Sn, Ni, Au, Ag, Ti, W, polysilicon, or other suitable electrically conductive material using electrolytic plating, electroless plating process, or other suitable metal deposition process to form z-direction vertical interconnect conductive through silicon vias (TSV) 306.

An insulating or passivation layer 308 is formed over a surface of substrate 304 and conductive vias 306 using PVD, CVD, printing, spin coating, spray coating, sintering or thermal oxidation. The insulating layer 308 contains one or more layers of SiO2, Si3N4, SiON, Ta2O5, Al2O3, or other material having similar insulating and structural properties. A portion of insulating layer 308 is removed by an etching process to expose substrate 304 and conductive vias 306.

An electrically conductive layer or RDL 310 is formed over the exposed substrate 304 and conductive vias 306 using a patterning and metal deposition process such as printing, PVD, CVD, sputtering, electrolytic plating, and electroless plating. Conductive layer 310 can be one or more layers of Al, Cu, Sn, Ni, Au, Ag, or other suitable electrically conductive material. Conductive layer 310 is electrically connected to conductive vias 306.

In FIG. 7f, a temporary substrate or carrier 314 contains sacrificial base material such as silicon, polymer, beryllium oxide, or other suitable low-cost, rigid material for structural support. An interface layer or double-sided tape 316 is formed over carrier 314 as a temporary adhesive bonding film or etch-stop layer. Leading with insulating layer 308 and conductive layer 310, substrate 304 is mounted to interface layer 316 over carrier 314. Carrier 300 and interface layer 302 are removed by chemical etching, mechanical peeling, CMP, mechanical grinding, thermal bake, UV light, laser scanning, or wet stripping to expose a surface of substrate 304 and conductive vias 306 opposite conductive layer 310.

An insulating or passivation layer 318 is formed over substrate 304 and conductive vias 306 using PVD, CVD, printing, spin coating, spray coating, sintering or thermal oxidation. The insulating layer 318 contains one or more layers of SiO2, Si3N4, SiON, Ta2O5, Al2O3, or other material having similar insulating and structural properties. A portion of insulating layer 318 is removed by an etching process to expose substrate 304 and conductive vias 306.

An electrically conductive layer or RDL 320 is formed over the exposed substrate 304 and conductive vias 306 using a patterning and metal deposition process such as printing, PVD, CVD, sputtering, electrolytic plating, and electroless plating. Conductive layer 320 can be one or more layers of Al, Cu, Sn, Ni, Au, Ag, or other suitable electrically conductive material. Conductive layer 320 is electrically connected to conductive vias 306. In another embodiment, conductive vias 306 are formed through substrate 304 after forming conductive layers 310 and/or 320. Conductive layers 310 and 320 can be formed prior to insulating layer 308 and 318, respectively. The resulting wafer-form substrate 322 provides electrical interconnect vertically and laterally across the substrate.

Figure 7G:
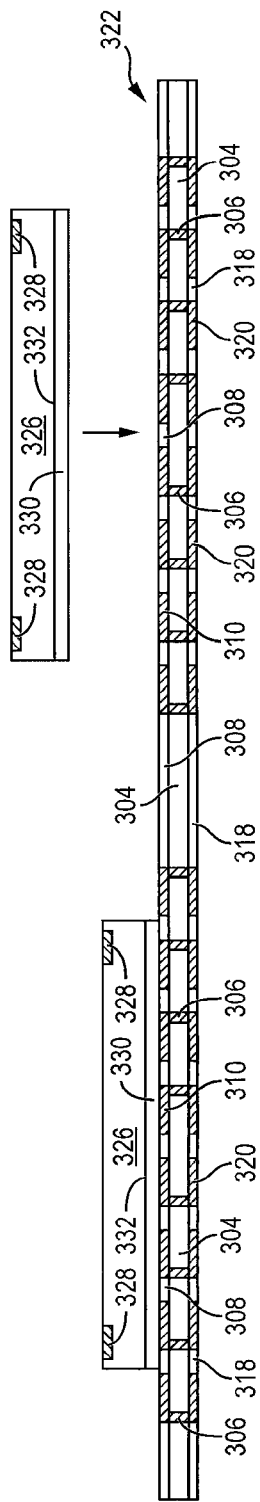

In FIG. 7g, semiconductor die 326 with contact pads 328, similar to semiconductor die 124 with contact pads 132 from FIGS. 3a-3c, is positioned over substrate 322. An adhesive 330 is disposed over back surface 332 of semiconductor die 326 opposite contact pads 328. Adhesive 330 includes a die attach adhesive, epoxy, or other adhesive material and is oriented toward substrate 322.

FIG. 7g further shows semiconductor die 326 mounted to substrate 322 using, for example, a pick and place operation. While FIG. 7g shows adhesive 330 is initially disposed on back surface 332 of semiconductor die 326, alternatively, adhesive 330 can be disposed on substrate 322 before mounting the semiconductor die to the substrate.

Figure 7H:
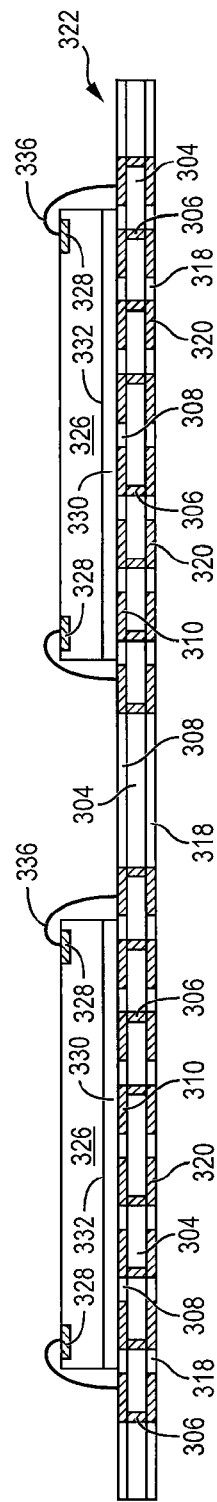

In FIG. 7h, bond wires 336 are formed between contact pads 328 on semiconductor die 326 and conductive layer 310 to electrically connect the semiconductor die to substrate 322. The use of bond wires 336 provides a low-cost, stable technology for forming electrical connections between semiconductor die 326 and substrate 322.

Figure 7I:
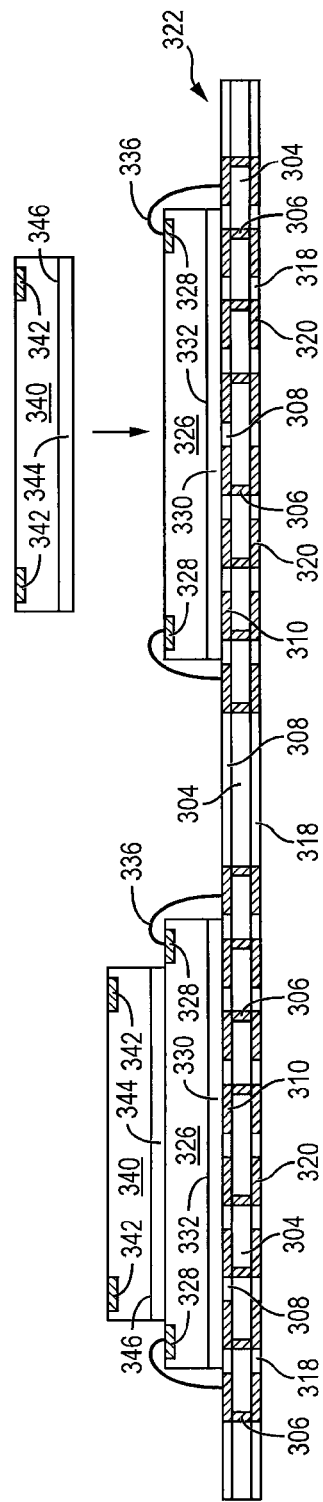

In FIG. 7i, semiconductor die 340 with contact pads 342, similar to semiconductor die 326 with contact pads 328 from FIG. 7g, is positioned over semiconductor die 326. An adhesive 344 is disposed over a back surface 346 of semiconductor die 340 opposite contact pads 342. Adhesive 344 includes a die attach adhesive, epoxy, or other adhesive material and is oriented toward an active surface of semiconductor die 326. While FIG. 7i shows adhesive 344 is initially disposed on back surface 346 of semiconductor die 340, adhesive 344 can also be disposed on semiconductor die 326 before mounting semiconductor die 340 to semiconductor die 326, rather than on back surface 346 of semiconductor die 340.

Figure 7J:
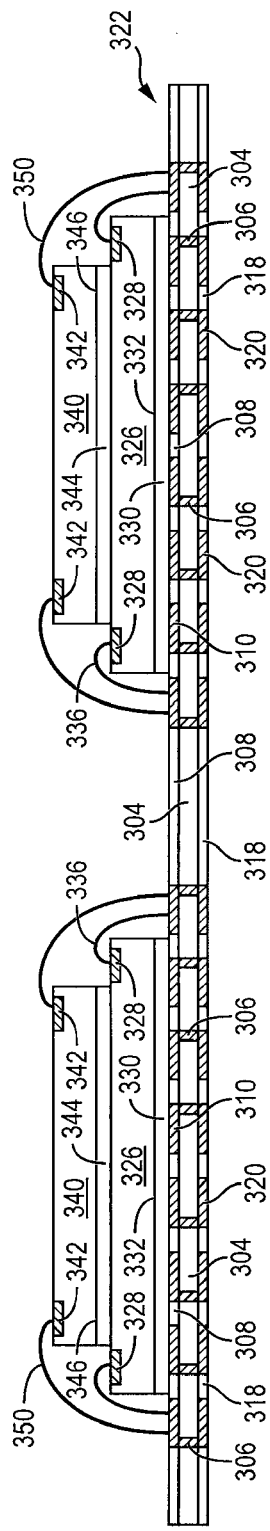

In FIG. 7j, semiconductor die 340 is mounted to semiconductor die 326, and over substrate 322, with adhesive 344. Bond wires 350 are formed between contact pads 342 of semiconductor die 340 and conductive layer 310 to electrically connect the semiconductor die to substrate 322. The use of bond wires 350 provides a low-cost, stable technology for forming the electrical connections between semiconductor die 340 and substrate 322.

Figure 7K:
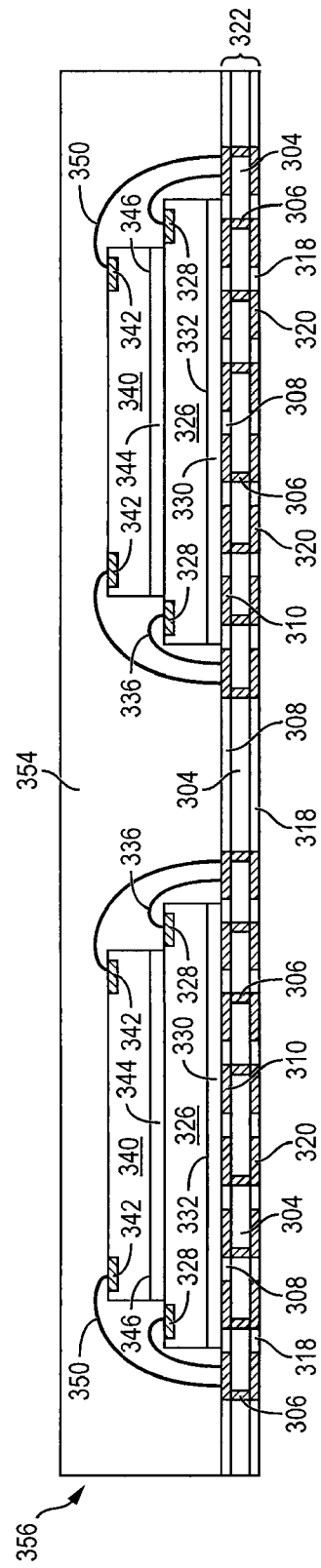

In FIG. 7k, an encapsulant or molding compound 354 is deposited over substrate 322, around semiconductor die 326 and 340, and around bond wires 336 and 350 using a paste printing, compressive molding, transfer molding, liquid encapsulant molding, vacuum lamination, spin coating, or other suitable applicator. Encapsulant 354 can be polymer composite material, such as epoxy resin with filler, epoxy acrylate with filler, or polymer with proper filler. The viscosity of encapsulant 354 is selected for uniform coverage, e.g., a lower viscosity increases the flow of the encapsulant. Encapsulant 354 is non-conductive and environmentally protects semiconductor devices 356 from external elements and contaminants.

Figure 7L:
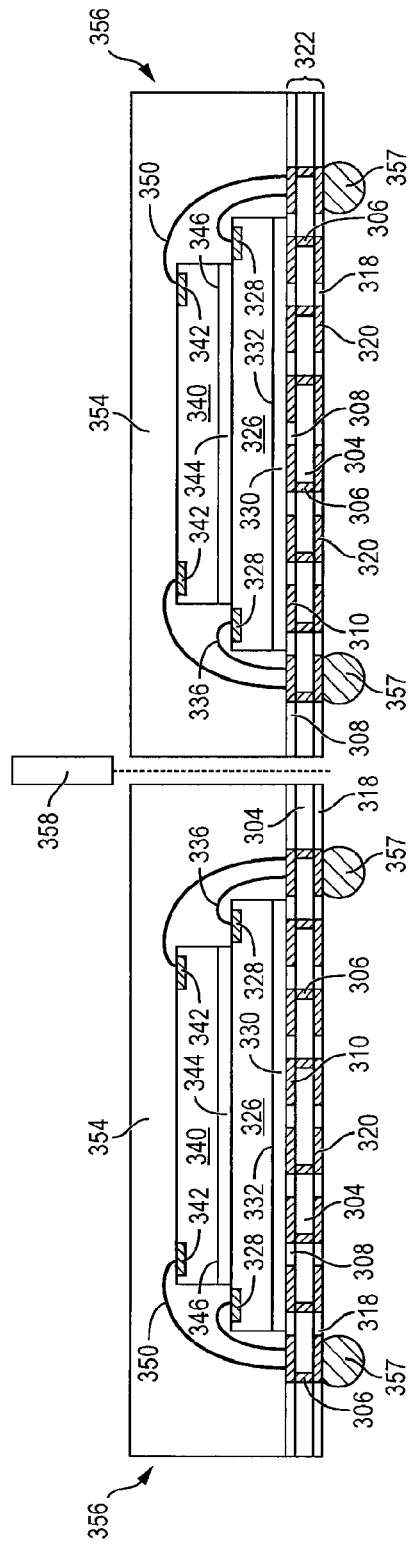

In FIG. 7l, an electrically conductive bump material is deposited over conductive layer 320 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 320 using a suitable attachment or bonding process. In one embodiment, the bump material is reflowed by heating the material above its melting point to form balls or bumps 357. In some applications, bumps 357 are reflowed a second time to improve electrical contact to conductive layer 320. Bumps 357 can also be compression bonded to conductive layer 320. Bumps 357 represent one type of interconnect structure that can be formed over conductive layer 320. The interconnect structure can also use stud bump, micro bump, or other electrical interconnect. Bumps 357 are part of semiconductor devices 356, which are configured for subsequent interconnection with semiconductor devices 292.

FIG. 7l further shows semiconductor devices 356 are singulated through encapsulant 354 and substrate 322 with saw blade or laser cutting tool 358 into individual semiconductor devices 356 for subsequent mounting with semiconductor devices 292.

Figure 7M:
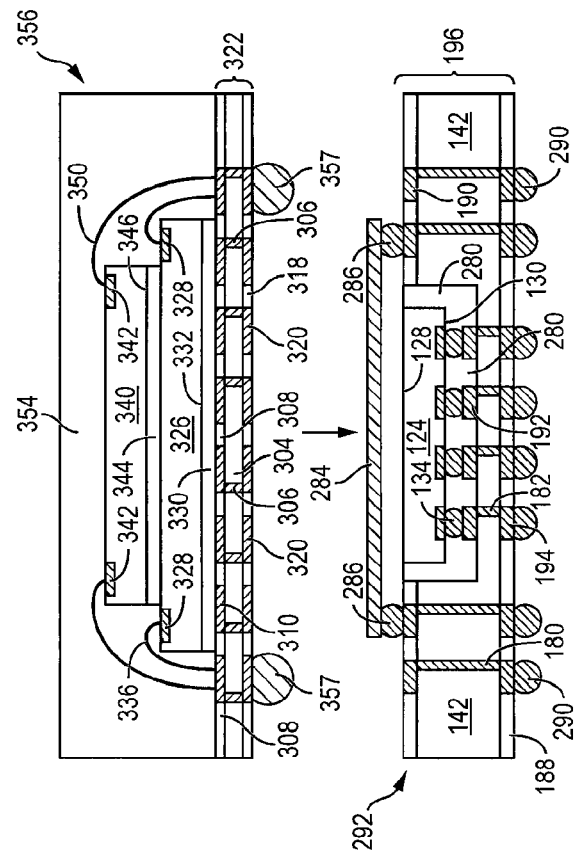

In FIG. 7m, singulated semiconductor device 356 is positioned over singulated semiconductor device 292 from FIG. 7c. Semiconductor device 356 is mounted to semiconductor device 292 with bumps 357 that connect conductive layer 190 to conductive layer 320. While FIG. 7m shows bumps 357 are part of semiconductor device 356 before semiconductor devices 292 and 356 are connected, bumps 357 can also be formed as part of semiconductor device 292 before connecting semiconductor devices 292 and 356. Furthermore, conductive layer 320, in addition to being connected to bumps 357, is also electrically and thermally connected to heat spreader 284. Heat spreader 284 aids with distribution and dissipation of heat generated by semiconductor die 326 and increases thermal performance. Thermal energy passes from semiconductor die 326 to heat spreader 284, and further passes through bumps 286, conductive layer 190, conductive vias 180, and conductive layer 194 to an external low-impedance ground point. Heat spreader 284 also serves to block or absorb EMI, RFI, harmonic distortion, and other inter-device interference among semiconductor die 124, 326, and 340. Mounting a substantially planar heat spreader 284 between semiconductor die 124 and 326 reduces package height and produces a semiconductor device that includes a smaller vertical profile than conventional packages.

FIG. 7n shows semiconductor device 356 mounted to semiconductor device 292 to form package 362 as a low profile dual-purpose shielding and heat-dissipation package with multiple vertically stacked semiconductor die.

In FIG. 8, another embodiment of a low profile dual-purpose shielding and heat-dissipation package 370, similar to package 362 from FIG. 7n, is shown. Package 370 includes a dual-purpose heat spreader and shielding layer 372 similar to heat spreader 284 from package 362. However, heat spreader 372 is mounted to backside 128 of semiconductor die 124 with TIM 374 rather than being connected to substrate 322 as in the embodiment shown in FIG. 7n. Heat spreader 372 aids with distribution and dissipation of heat generated by semiconductor die 124 and increases thermal performance of package 370. Thermal energy passes from semiconductor die 124 to heat spreader 372 through TIM 374. From heat spreader 372, heat is conducted through bumps 376, conductive layer 190, conductive vias 180, conductive layer 194, and bumps 290 to an external low-impedance ground point. By mounting semiconductor die 124 within recess 178, a height of semiconductor die 124 extending above substrate 196 is reduced, and the overall profile of dual-purpose shielding and heat-dissipation package 370 is also reduced. The planar shape of heat spreader 372, in addition to reducing the package profile, is also simpler to manufacture than non-planar heat spreaders, thereby reducing manufacturing difficulty and cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a substrate including a recess formed partially through the substrate;
    a conductive via formed through a surface of the substrate;
    a first semiconductor die disposed within the recess over the conductive via;
    a planar shaped heat spreader in thermal contact with the first semiconductor die;
    a second semiconductor die disposed over the planar shaped heat spreader; and
    a first bond wire extending from the second semiconductor die through an opening in the planar shaped heat spreader to the substrate.

2. The semiconductor device of claim 1, further including:
    a third semiconductor die disposed over the second semiconductor die; and
    a second bond wire extending from the third semiconductor die through the opening in the planar shaped heat spreader to the substrate.

3. The semiconductor device of claim 1, wherein the planar shaped heat spreader includes a roughened surface.

4. The semiconductor device of claim 1, further including a support structure extending orthogonally from the planar shaped heat spreader.

5. The semiconductor device of claim 1, wherein the planar shape of the planar shaped heat spreader reduces a vertical profile of the semiconductor device and increases manufacturability.

6. A semiconductor device, comprising:
    a first substrate including a recess formed partially through the first substrate;
    a conductive via formed through a surface of the first substrate;
    a first semiconductor die disposed within the recess;
    a heat spreader including a planar surface in thermal contact with the first semiconductor die;
    a second semiconductor die disposed over the heat spreader; and
    a first bond wire extending through an opening in the heat spreader to the substrate.

7. The semiconductor device of claim 6, further including a third semiconductor die disposed over the second semiconductor die.

8. The semiconductor device of claim 6, wherein the heat spreader includes copper, aluminum, stainless steel, nickel silver, low-carbon steel, or other metal and composite comprising high thermal conductivity capable of blocking or absorbing electromagnetic interference, radio frequency interference, harmonic distortion, or other inter-device interference.

9. The semiconductor device of claim 6, wherein the planar surface of the heat spreader reduces a vertical profile of the semiconductor device and increases manufacturability.

10. A semiconductor device, comprising:
    a substrate including a recess;
    a conductive via formed through a surface of the substrate;
    a first semiconductor die disposed within the recess, wherein an active surface of the first semiconductor die is oriented toward the substrate and electrically connected to the conductive via;
a shield disposed over a non-active surface of the first semiconductor die opposite the active surface and electrically connected to the substrate;
a second semiconductor die disposed over the shield;
a third semiconductor die disposed over the second semiconductor die; and
a bond wire extending from the third semiconductor die through an opening in the shield to the substrate.

11. A semiconductor device, comprising:
a substrate including a recess;
a conductive via formed through a surface of the substrate;
a first semiconductor die disposed within the recess, wherein an active surface of the first semiconductor die is oriented toward the substrate and electrically connected to the conductive via;
a shield disposed over a non-active surface of the first semiconductor die opposite the active surface and electrically connected to the substrate;
a second semiconductor die disposed over the shield; and
a bond wire extending from the second semiconductor die through an opening in the shield to the substrate.

12. The semiconductor device of claim 11, wherein the shield includes copper, aluminum, stainless steel, nickel silver, low-carbon steel, or other metal and composite comprising high thermal conductivity capable of blocking or absorbing electromagnetic interference, radio frequency interference, harmonic distortion, or other inter-device interference.

13. The semiconductor device of claim 11, wherein the shield extends to a perimeter of the substrate.

14. The semiconductor device of claim 1, wherein the planar shaped heat spreader includes copper, aluminum, stainless steel, nickel silver, low-carbon steel, or other metal and composite comprising high thermal conductivity capable of blocking or absorbing electromagnetic interference, radio frequency interference, harmonic distortion, or other inter-device interference.

* * * * *